United States Patent
Jones et al.

(10) Patent No.: US 9,438,184 B2
(45) Date of Patent: Sep. 6, 2016

(54) INTEGRATED PASSIVE DEVICE ASSEMBLIES FOR RF AMPLIFIERS, AND METHODS OF MANUFACTURE THEREOF

(71) Applicants: Jeffrey K. Jones, Chandler, AZ (US); Basim H. Noori, Gilbert, AZ (US); Michael E. Watts, Scottsdale, AZ (US)

(72) Inventors: Jeffrey K. Jones, Chandler, AZ (US); Basim H. Noori, Gilbert, AZ (US); Michael E. Watts, Scottsdale, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/317,572

(22) Filed: Jun. 27, 2014

(65) Prior Publication Data

US 2015/0381121 A1     Dec. 31, 2015

(51) Int. Cl.
| | |
|---|---|
| *H01L 21/8242* | (2006.01) |
| *H01L 29/86* | (2006.01) |
| *H01L 29/06* | (2006.01) |
| *H03F 3/21* | (2006.01) |

(Continued)

(52) U.S. Cl.
CPC ............... *H03F 3/21* (2013.01); *H01L 23/047* (2013.01); *H01L 24/49* (2013.01); *H01L 24/85* (2013.01); *H01L 25/165* (2013.01); *H01L 25/50* (2013.01); *H03F 1/565* (2013.01); *H03F 3/193* (2013.01); *H03F 3/195* (2013.01); *H01L 2924/1205* (2013.01); *H01L 2924/1206* (2013.01); *H01L 2924/1207* (2013.01); *H01L 2924/1304* (2013.01); *H01L 2924/13091* (2013.01); *H03F 2200/222* (2013.01); *H03F 2200/387* (2013.01); *H03F 2200/451* (2013.01)

(58) Field of Classification Search
CPC ....... H01L 23/04; H01L 28/40; H01L 24/49; H01L 2924/1205; H01L 24/85; H01L 25/50
See application file for complete search history.

(56) References Cited

U.S. PATENT DOCUMENTS

| | | |
|---|---|---|
| 5,066,925 A | 11/1991 | Freitag |
| 5,736,901 A | 4/1998 | Nakamura |

(Continued)

FOREIGN PATENT DOCUMENTS

| | | |
|---|---|---|
| WO | 0182672 A1 | 11/2001 |
| WO | 2009130544 A1 | 10/2009 |
| WO | 2010038111 A1 | 4/2010 |

OTHER PUBLICATIONS

U.S. Appl. No. 14/211,410, Embar, filed Mar. 14, 2014.

(Continued)

*Primary Examiner* — Thomas L Dickey
*Assistant Examiner* — Damon Hillman
(74) *Attorney, Agent, or Firm* — Sherry W. Schumm

(57) ABSTRACT

An embodiment of an integrated passive device (IPD) assembly includes a first capacitor formed over a semiconductor substrate, where the first capacitor includes a first capacitor electrode, a second capacitor electrode, and dielectric material that electrically insulates the first capacitor electrode from the second capacitor electrode. The IPD assembly also includes a first contact pad exposed at a top surface of the IPD assembly and electrically coupled to the second capacitor electrode, and a second contact pad exposed at the top surface of the IPD. A second capacitor is coupled to the top surface of the IPD, and includes a first terminal electrically coupled to the first contact pad, and a second terminal electrically coupled to the second contact pad. The IPD assembly may be included in a packaged RF device, forming portions of an output impedance matching circuit and an envelope frequency termination circuit.

20 Claims, 8 Drawing Sheets

(51) Int. Cl.
*H01L 25/00* (2006.01)
*H01L 25/16* (2006.01)
*H01L 23/00* (2006.01)
*H03F 1/56* (2006.01)
*H01L 23/047* (2006.01)
*H03F 3/195* (2006.01)
*H03F 3/193* (2006.01)

(56) References Cited

U.S. PATENT DOCUMENTS

| | | |
|---|---|---|
| 5,808,527 A | 9/1998 | De Los Santos |
| 6,072,211 A | 6/2000 | Miller et al. |
| 6,072,238 A | 6/2000 | Viswanathan et al. |
| 6,081,160 A | 6/2000 | Custer et al. |
| 6,507,101 B1 | 1/2003 | Morris |
| 6,731,174 B2 | 5/2004 | Krvavac |
| 6,822,321 B2 | 11/2004 | Crescenzi |
| 7,029,971 B2* | 4/2006 | Borland ............ H01G 4/1218 438/250 |
| 7,057,464 B2 | 6/2006 | Bharj |
| 7,135,643 B2 | 11/2006 | Van Haaster et al. |
| 7,368,668 B2 | 5/2008 | Ren et al. |
| 7,372,334 B2 | 5/2008 | Blair et al. |
| 7,564,303 B2 | 7/2009 | Perugupalli et al. |
| 8,030,763 B2 | 10/2011 | Romero et al. |
| 8,253,495 B2 | 8/2012 | Bouisse |
| 8,324,728 B2 | 12/2012 | Tabrizi |
| 8,350,367 B2 | 1/2013 | Chiu et al. |
| 8,659,359 B2 | 2/2014 | Ladhani et al. |
| 9,106,187 B2 | 8/2015 | Ladhani et al. |
| 2007/0024358 A1 | 2/2007 | Perugupalli et al. |
| 2007/0029662 A1 | 2/2007 | Lee |
| 2007/0090515 A1 | 4/2007 | Condie et al. |
| 2007/0158787 A1* | 7/2007 | Chanchani ......... B81C 1/00238 257/619 |
| 2007/0273449 A1 | 11/2007 | Wilson |
| 2008/0231373 A1 | 9/2008 | Rahman et al. |
| 2008/0246547 A1 | 10/2008 | Blednov |
| 2009/0130544 A1 | 5/2009 | Chang et al. |
| 2010/0038111 A1 | 2/2010 | Yabe et al. |
| 2011/0031571 A1 | 2/2011 | Bouisse |
| 2011/0156203 A1* | 6/2011 | Park ...................... H01C 1/014 257/528 |
| 2013/0033325 A1 | 2/2013 | Ladhani et al. |
| 2014/0022020 A1 | 1/2014 | Aaen et al. |
| 2014/0070365 A1 | 3/2014 | Viswanathan et al. |
| 2014/0167863 A1 | 6/2014 | Ladhani et al. |
| 2014/0179243 A1 | 6/2014 | Bouisse et al. |

OTHER PUBLICATIONS

U.S. Appl. No. 14/316,484, Shah, filed Jun. 26, 2014.
Kahn, "Multilayer Ceramic Capacitors—Materials and Manufacture", Technical Information, AVX, Sep. 5, 2000, 8 pages.
Non-Final Office Action mailed Jan. 4, 2013 for U.S. Appl. No. 12/746,793, 10 pages.
Non-Final Office Action mailed May 28, 2013 for U.S. Appl. No. 12/746,793, 9 pages.
Notice of Allowance mailed Oct. 10, 2013 for U.S. Appl. No. 12/746,793, 7 pages.
Non-Final Office Action mailed Jul. 7, 2014 for U.S. Appl. No. 14/185,291, 15 pages.
Notice of Allowance mailed Mar. 5, 2015 for U.S. Appl. No. 14/185,291, 7 pages.
Notice of Allowance mailed Oct. 29, 2014 for U.S. Appl. No. 14/185,291, 6 pages.
Non-Final Office Action mailed Aug. 11, 2014 for U.S. Appl. No. 14/185,382, 12 pages.
Non-Final Office Action mailed Dec. 29, 2014 for U.S. Appl. No. 14/185,382, 9 pages.
Notice of Allowance mailed May 29, 2015 for U.S. Appl. No. 14/185,382, 5 pages.
Notice of Allowance mailed Oct. 29, 2015 for U.S. Appl. No. 13/611,793, 9 pages.
Restriction Requirement mailed Oct. 25, 2013 for U.S. Appl. No. 13/611,793, 5 pages.
Non-Final Office Action mailed Dec. 6, 2013 for U.S. Appl. No. 13/611,793, 14 pages.
Final Office Action mailed Sep. 4, 2014 for U.S. Appl. No. 13/611,793, 14 pages.
Non-Final Office Action mailed Apr. 11, 2016 for U.S. Appl. No. 14/942,419 11 pages.

* cited by examiner

US 9,438,184 B2

INTEGRATED PASSIVE DEVICE ASSEMBLIES FOR RF AMPLIFIERS, AND METHODS OF MANUFACTURE THEREOF

TECHNICAL FIELD

Embodiments of the subject matter described herein relate generally to packaged semiconductor devices, and more particularly to packaged, radio frequency (RF) semiconductor devices that include impedance matching circuits.

BACKGROUND

A typical high power, radio frequency (RF) semiconductor device may include one or more input leads, one or more output leads, one or more transistors, bondwires coupling the input lead(s) to the transistor(s), and bondwires coupling the transistor(s) to the output lead(s). The bondwires have significant inductances at high frequencies, and such inductances may be factored into the design of input and output circuits for a device. In some cases, input and output circuits may be contained within the same package that contains the device's transistor(s). More specifically, an in-package, input impedance matching circuit may be coupled between a device's input lead and a control terminal (e.g., the gate) of a transistor, and an in-package, output circuit (e.g., including an output impedance matching circuit and an envelope frequency termination circuit) may be coupled between a current conducting terminal (e.g., the drain) of a transistor and a device's output lead. Each of the input and output circuits may include one or more capacitive and resistive elements, along with the inductances inherent in the sets of bondwires interconnecting those elements with the device's transistor(s) and with the input and output leads. The values of the various components in the input and output circuits affect a number of device performance parameters, including device efficiency, instantaneous signal bandwidth (ISBW), and so on.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Packaged RF semiconductor devices are available, which have decent performance when used in relatively narrowband applications with relatively low instantaneous signal bandwidth (ISBW) (e.g., ISBW of 150 megahertz (MHz) or less). However, increased ISBW (e.g., ISBW of 200 MHz or more) is becoming a major requirement for RF communication amplifiers (e.g., RF communication infrastructure amplifiers). This requirement stems from the fact that larger information downloads per second is becoming a significant enablement feature. Thus, trends in the RF communication industry include development of packaged RF semiconductor devices with increasingly wideband operation and relatively high ISBW.

Designing sufficiently wideband devices with high ISBW is challenging for a number of reasons. For example, the ISBW of a device may be directly affected by the low frequency resonance (LFR) caused by interaction between the device's bias feeds and output circuits that are electrically connected between a device's transistor(s) and its output lead(s). More particularly, inductances of bondwires that interconnect various output circuit components may limit the LFR of the device. To increase the LFR, and thus to increase the ISBW of the device, increasingly large capacitors may be included in certain portions of the output circuits to provide an RF ground down to envelope frequencies. However, to accommodate increasingly large capacitors, package sizes would need to be increased as well. Increasing semiconductor device package size is incompatible with the industry trends to reduce device size and cost.

Embodiments of the inventive subject matter include integrated passive device (IPD) assemblies, RF amplifiers that include IPD assemblies, and packaged semiconductor devices (e.g., packaged radio frequency (RF) amplifier devices) that include IPD assemblies. As will be discussed in more detail below, an embodiment of an RF amplifier device includes an active device (e.g., a transistor), an input impedance matching circuit coupled between an input to the RF amplifier device and an input to the active device, and an output circuit (including an envelope frequency termination circuit and an output impedance matching circuit) coupled between an output of the active device and an output of the RF amplifier device. According to various embodiments, portions of the output circuit are implemented with an IPD assembly, which includes various capacitive and resistive components of the output circuit. More specifically, the IPD assembly may include portions of an envelope frequency termination circuit and an output impedance matching circuit, in which envelope frequency bondwire inductances present in conventional circuits have been reduced. Reduction of the effective inductance will result in an increase in the LFR and thus improved ISBW of the RF amplifier device, when compared with conventional devices.

Figure 1:
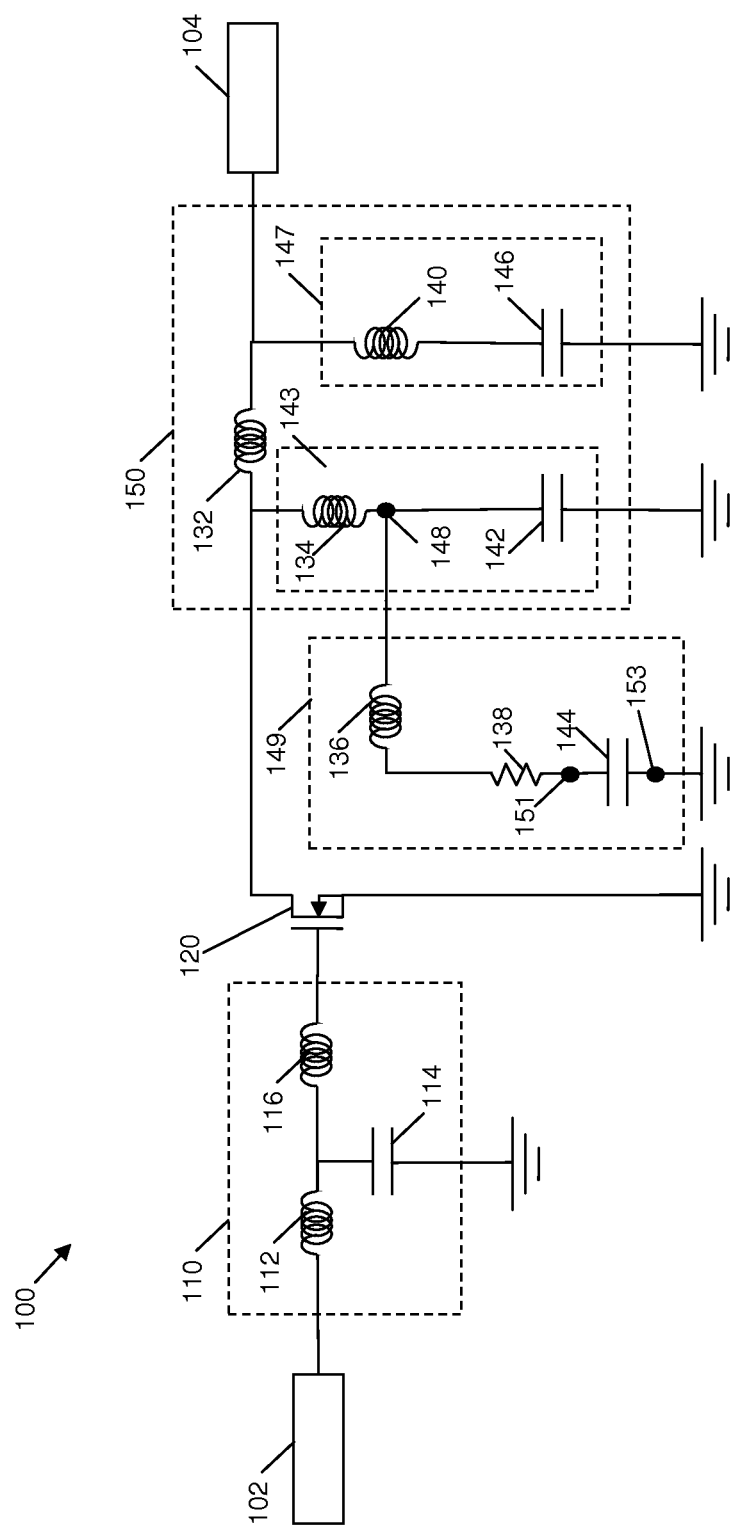
FIG. 1 is a schematic diagram of an RF amplifier with input and output circuits, in accordance with an example embodiment.

FIG. 1 is a schematic diagram of an RF amplifier device 100. Device 100 includes an input lead 102, an input impedance matching circuit 110, a transistor 120, an envelope frequency termination circuit 149, an output impedance matching circuit 150, and an output lead 104, in an embodiment. The envelope frequency termination circuit 149 and the output impedance matching circuit 150 may be referred to collectively as an "output circuit." Although transistor 120 and various elements of the input and output impedance matching circuits 110, 150 and the envelope frequency termination circuit 149 are shown as singular components, the depiction is for the purpose of ease of explanation only. Those of skill in the art would understand, based on the description herein, that transistor 120 and/or certain elements of the input and output impedance matching circuits 110, 150 and the envelope frequency termination circuit 149 each may be implemented as multiple components (e.g., connected in parallel or in series with each other), and examples of such embodiments are illustrated in the other Figures and described later. For example, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads). The description of transistor 120 and various elements of the input and output impedance matching circuits 110, 150 and the envelope frequency termination circuit 149, below, thus are not intended to limit the scope of the inventive subject matter only to the illustrated embodiments.

Input lead 102 and output lead 104 each include a conductor, which is configured to enable the device 100 to be electrically coupled with external circuitry (not shown). More specifically, input and output leads 102, 104 are physically located between the exterior and the interior of the device's package. Input impedance matching circuit 110 is electrically coupled between the input lead 102 and a first terminal of transistor 120, which is also located within the device's interior, and output impedance matching circuit 150 and envelope frequency termination circuit 149 are electrically coupled between a second terminal of transistor 120 and the output lead 104.

According to an embodiment, transistor 120 is the primary active component of device 100. Transistor 120 includes a control terminal and two current conducting terminals, where the current conducting terminals are spatially and electrically separated by a variable-conductivity channel. For example, transistor 120 may be a field effect transistor (FET) (such as a metal oxide semiconductor FET (MOSFET)), which includes a gate (control terminal), a drain (a first current conducting terminal), and a source (a second current conducting terminal). Alternatively, transistor 120 may be a bipolar junction transistor (BJT). Accordingly, references herein to a "gate," "drain," and "source," are not intended to be limiting, as each of these designations has analogous features for a BJT implementation (e.g., a base, collector, and emitter, respectively). According to an embodiment, and using nomenclature typically applied to MOSFETs in a non-limiting manner, the gate of transistor 120 is coupled to the input impedance matching circuit 110, the drain of transistor 120 is coupled to the output impedance matching circuit 150 and the envelope frequency termination circuit 149, and the source of transistor 120 is coupled to ground (or another voltage reference). Through the variation of control signals provided to the gate of transistor 120, the current between the current conducting terminals of transistor 120 may be modulated.

Input impedance matching circuit 110 is configured to raise the impedance of device 100 to a higher (e.g., intermediate or higher) impedance level (e.g., in a range from about 2 to about 10 Ohms or higher). This is advantageous in that it allows the printed circuit board level (PCB-level) matching interface from a driver stage to have an impedance that can be achieved in high-volume manufacturing with minimal loss and variation (e.g., a "user friendly" matching interface). Input impedance matching circuit 110 is coupled between the input lead 202 and the control terminal (e.g., gate) of the transistor 120. According to an embodiment, input impedance matching circuit 110 includes two inductive elements 112, 116 (e.g., two sets of bondwires) and a shunt capacitor 114. A first inductive element 112 (e.g., a first set of bondwires) is coupled between input lead 102 and a first terminal of capacitor 114, and a second inductive element 116 (e.g., a second set of bondwires) is coupled between the first terminal of capacitor 114 and the control terminal of transistor 120. The second terminal of capacitor 114 is coupled to ground (or another voltage reference). The combination of inductive elements 112, 116 and shunt capacitor 114 functions as a low-pass filter. According to an embodiment, the series combination of inductive elements 112, 116 may have a value in a range between about 50 picohenries (pH) to about 3 nanohenries (nH), and shunt capacitor 114 may have a value in a range between about 5 picofarads (pF) to about 80 pF.

Output impedance matching circuit 150 is configured to match the output impedance of device 100 with the input impedance of an external circuit or component (not shown) that may be coupled to output lead 104. Output impedance matching circuit 150 is coupled between the first current conducting terminal (e.g., drain) of transistor 120 and the output lead 104. According to an embodiment, output impedance matching circuit 150 includes three inductive elements 132, 134, 140 (e.g., three sets of bondwires) and two capacitors 142, 146. A first inductive element 132 (e.g., a third set of bondwires), which may be referred to herein as a "series inductor," is coupled between the first current conducting terminal (e.g., drain) of transistor 120 and the output lead 104. A second inductive element 134 (e.g., a fourth set of bondwires), which may be referred to herein as a "shunt inductor," is coupled between the first current conducting terminal of transistor 120 and a first terminal of a first capacitor 142, which may be referred to herein as a "shunt capacitor." Finally, a third inductive element 140 (e.g., a fifth set of bondwires), which may be referred to herein as a "low-pass matching inductor," is coupled between the output lead 104 and a first terminal of a second capacitor 146, which may be referred to herein as a "low-pass matching capacitor." Second terminals of the shunt and low-pass matching capacitors 142, 146 are coupled to ground (or to another voltage reference), in an embodiment.

Shunt inductor 134 and shunt capacitor 142 are coupled in series between a current conducting terminal of transistor 120 and ground, and this combination of impedance matching elements functions as a first (high-pass) matching stage. Accordingly, the combination of shunt inductor 134 and shunt capacitor 142 may be referred to herein as a high-pass matching circuit 143. According to an embodiment shunt inductor 134 may have a value in a range between about 100 pH to about 3 nH, and shunt capacitor 142 may have a value in a range between about 50 pF to about 500 pF, although these components may have values outside of these ranges, as well.

An RF "cold point" is present at the node 148 between shunt inductor 134 and shunt capacitor 142, where the RF cold point represents a high impedance point in the circuit. Envelope frequency termination circuit 149 is coupled between the RF cold point (at node 148) and ground (or another voltage reference). Envelope frequency termination circuit 149 functions to improve the low frequency resonance of device 100 caused by the interaction between the output impedance matching circuit 150 and the bias feeds (not shown) by presenting a high impedance at RF frequencies. Envelope frequency termination circuit 149 essentially is "invisible" from a matching standpoint, as it only effects the output impedance at envelope frequencies (i.e., envelope frequency termination circuit 149 provides terminations for the envelope frequencies of device 100).

According to an embodiment, envelope frequency termination circuit 149 includes an inductance 136, a resistor 138, and a capacitor 144 coupled in series. In a conventional device, the inductance 136, which may be referred to herein as an "envelope inductance," typically is implemented as a set of bondwires coupling node 148 to resistor 138. In such a conventional implementation, envelope inductance 136 may have a value in a range between about 5 pH to about 500 pH. Unfortunately, in a conventional device, the non-trivial inductance associated with envelope inductance 136, which is in parallel with the bias feeds of the RF amplifier device 100, imposes limits on the LFR of the device 100, which in turn limits the ISBW achievable by device 100.

According to an embodiment, envelope inductance 136 is substantially reduced in the envelope frequency termination circuit 149. Reduction of envelope inductance 136 is achieved by eliminating the bondwire connections between the RF cold point at node 148 and the other components of the envelope frequency termination circuit 149 (i.e., resistor 138 and capacitor 144). More particularly, and as will be explained in more detail below, embodiments of RF amplifier devices include IPD assemblies (e.g., IPD assembly 500, FIG. 5) in which shunt capacitor 142, resistor 138, and capacitor 144 are coupled together and to ground (or another voltage reference) with connections having very low and tightly controlled inductance. Tight control of the envelope inductance 136 is achieved, according to various embodiments, by connecting the shunt capacitor 142, resistor 138, and capacitor 144 through photolithographically formed connections within IPD assembly 500 (e.g., conductive traces and vias), rather than through wirebonds. Because tolerances achievable using photolithographic processes are tighter than tolerances achievable using a machine wirebond system, the envelope inductance 136 may be more tightly controlled, using embodiments of the inventive subject matter. The IPD assemblies of the various embodiments substantially reduce and control the inductance value of envelope inductance 136, thus reducing the total inductance included in the envelope frequency termination circuit 149. This has the effect of increasing both the LFR and ISBW of the device 100.

Although envelope inductance 136 is represented as a single component in FIG. 1, in actuality envelope inductance 136 represents multiple small inductances from multiple low-inductance connections within the envelop frequency termination circuit 149, as will be explained below. According to an embodiment, a first terminal of resistor 138, which may be referred to herein as an "envelope resistor," is coupled to node 148 (i.e., the RF cold point), through a first low-inductance connection (e.g., a portion of contact pad 541 and vias 810, FIGS. 5, 8) that represents a first portion of envelope inductance 136. At node 151, a second terminal of envelope resistor 138 is coupled to a first terminal of capacitor 144, which may be referred to herein as an "envelope capacitor," through a second low-inductance connection (e.g., contact pad 530, FIG. 5) that represents a second portion of envelope inductance 136. At node 153, a second terminal of the envelope capacitor 144 is coupled to ground (or another voltage reference), in an embodiment, through a third low-inductance connection (e.g., bond pad 532 and vias 534 and 734, FIG. 7) that represents a third portion of envelope inductance 136. Envelope resistor 138 may have a value in a range between about 0.1 Ohm to about 2 Ohm, and envelope capacitor 144 may have a value in a range between about 10 nanofarads (nF) to about 1 microfarad (μF), although these components may have values outside of these ranges, as well. Envelope inductance 136 due to the low-inductance connections between shunt capacitor 142, resistor 138, capacitor 144, and ground (or another voltage reference) is less than about 100-200 pH, in an embodiment. As will be described in more detail later, shunt capacitor 142, envelope resistor 138, and envelope capacitor 144 all form portions of the aforementioned IPD assembly (e.g., IPD assembly 500, FIG. 5).

Low-pass matching inductor 140 and low-pass matching capacitor 146 are coupled in series between the output lead 104 and ground (or another voltage reference), and this combination of impedance matching elements functions as a second (low-pass) matching stage. Accordingly, the combination of low-pass matching inductor 140 and low-pass matching capacitor 146 may be referred to herein as a low-pass matching circuit 147. According to an embodiment low-pass matching inductor 140 may have a value in a range between about 50 pH to about 1 nH, and low-pass matching capacitor 146 may have a value in a range between about 1 pF to about 50 pF, although these components may have values outside of these ranges, as well. According to an alternate embodiment, low pass matching circuit 147 may be excluded altogether from device 100 (e.g., as in the embodiment illustrated in FIG. 9).

Figure 2:
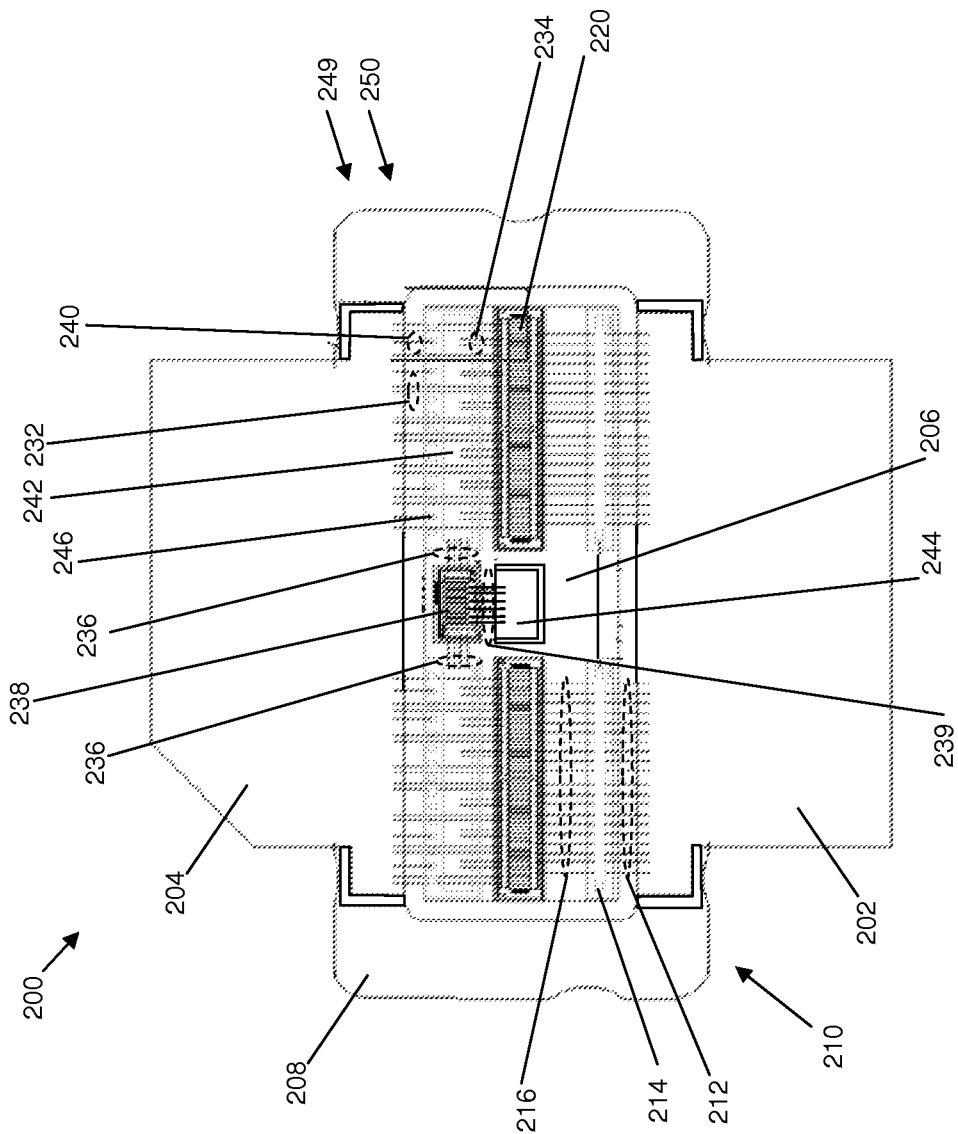
FIG. 2 is a top view of an example of a conventional packaged RF amplifier device that embodies the circuit of FIG. 1.

FIG. 2 is a top view of an example of a conventional packaged RF amplifier device 200 that embodies the circuit of FIG. 1, including an envelope inductor (i.e., envelope inductance 136) with an inductance value that is significantly higher and less tightly controllable than the envelope inductance achievable using embodiments of the present invention. More particularly, the interconnected electrical components and elements of device 200 may be modeled by the schematic diagram of FIG. 1. Device 200 includes an input lead 202 (e.g., input lead 102, FIG. 1), an output lead 204 (e.g., output lead 104, FIG. 1), a flange 206, an isolation structure 208, two transistors 220 (e.g., transistor 120, FIG. 1, implemented as parallel devices), an input impedance matching circuit 210 (e.g., input impedance matching circuit 110, FIG. 1), an envelope frequency termination circuit 249 (e.g., envelope frequency termination circuit 149, FIG. 1), and an output impedance matching circuit 250 (e.g., output impedance matching circuit 150, FIG. 1).

Flange 206 includes a rigid electrically-conductive substrate, which has a thickness that is sufficient to provide structural support for other components and elements of device 200. In addition, flange 206 may function as a heat sink for transistors 220 and other devices mounted on flange 206. Flange 206 has a top and bottom surface and a substantially-rectangular perimeter that corresponds to the perimeter of the device 200. In FIG. 2, only a central portion of the top surface of flange 206 is visible through an opening in isolation structure 208. Flange 206 has a conductive top surface (i.e., the surface on which isolation structure 208 is attached), and may be formed entirely from a conductive material. When device 200 is incorporated into a larger electrical system, flange 206 may be used to provide a ground reference for the device 200.

Isolation structure 208 is attached to the top surface of flange 206. For example, isolation structure 208 may include a layer of metallization on its bottom surface, which may be soldered to or otherwise attached to the top surface of flange 206. Isolation structure 208 is formed from a rigid, electrically insulating material, and has a top surface and an opposed bottom surface. Isolation structure 208 generally has a frame shape, which includes a substantially enclosed structure with a central opening.

The input and output leads 202, 204 are mounted on a top surface of the isolation structure 208 on opposed sides of the central opening, and thus the input and output leads 202, 204 are elevated above the top surface of the flange 206, and are electrically isolated from the flange 206. Generally, the input and output leads 202, 204 are oriented in order to allow for attachment of bondwires (e.g., bondwires 212, 232, 240) between the input and output leads 202, 204 and components and elements coupled to flange 206 within the central opening of isolation structure 208.

Transistors 220 and various elements 214, 238, 242, 244, 246 of the input and output impedance matching circuits 210, 250 are mounted on a generally central portion of the top surface of a flange 206 that is exposed through the opening in isolation structure 208. As used herein, an "active device area" corresponds to a portion of a device on which one or more active devices (e.g., transistor 220) are mounted (e.g., the portion of the conductive surface of flange 206 that exposed through the opening in isolation structure 208). Alternatively, an "active device area" may be defined as a portion of a device that is contained within the opening in the device's isolation structure (e.g., the portion of device 200 within the opening of isolation structure 208). Any portion of device 200 that does not correspond to the portion of flange 206 that is exposed through the opening in isolation structure 208 is not considered to be within the active device area. Accordingly, in FIG. 2, transistors 220 are positioned within the active device area of device 200. In addition, impedance matching elements 214, 238, 242, 244, 246 also are positioned within the active device area of device 200.

Each of transistors 220 has a control terminal (e.g., a gate) and two current conducting terminals (e.g., a drain and a source). The control terminal of each transistor 220 is coupled to an input impedance matching circuit 210 (e.g., through bondwires 216 between input capacitor 214 and transistor 220). In addition, one current conducting terminal (e.g., the drain) of each transistor 220 is coupled to an output impedance matching circuit 250 (e.g., through bondwires 234 between transistor 220 and capacitor 242), and the other current conducting terminal (e.g., the source) is coupled to the flange 206 (e.g., to ground).

Each input impedance matching circuit 210 (e.g., input impedance matching circuit 110, FIG. 1) is coupled between the input lead 202 (e.g., input lead 102, FIG. 1) and the control terminal of a transistor 220 (e.g., transistor 120, FIG. 1). In the device 200 of FIG. 2, the input impedance matching circuit 210 includes two inductive elements 212, 216 (e.g., inductive elements 112, 116, FIG. 1) and a capacitor 214 (e.g., capacitor 114, FIG. 1). Each inductive element 212, 216 is formed from a plurality of parallel, closely-spaced sets of bondwires. For example, a first inductive element 212 (e.g., inductive element 112, FIG. 1) includes a plurality of bondwires coupled between input lead 202 and a first terminal of capacitor 214 (e.g., capacitor 114, FIG. 1), and a second inductive element 216 (e.g., inductive element 116, FIG. 1) includes a plurality of bondwires coupled between the first terminal of capacitor 214 and the control terminal of transistor 220. The second terminal of capacitor 214 is coupled to the flange 206 (e.g., to ground). Capacitor 214 may be, for example, a discrete silicon capacitor (e.g., comprised of a silicon substrate with a top surface corresponding to a first terminal, and a bottom surface corresponding to a second terminal), a discrete ceramic capacitor, or another type of capacitor. Bondwires 212, 216 are attached to a conductive top plate at the top surface of capacitor 214.

Each output impedance matching circuit 250 (e.g., output impedance matching circuit 150, FIG. 1) is coupled between a first current conducting terminal (e.g., drain) of a transistor 220 (e.g., transistor 120, FIG. 1) and the output lead 204 (e.g., output lead 104, FIG. 1). In the device 200 of FIG. 2, the output impedance matching circuit 250 includes three inductive elements 232, 234, 240 (e.g., inductors 132, 134, 140, FIG. 1) and two capacitors 242, 246 (e.g., capacitors 142, 146, FIG. 1). Again, each inductive element 232, 234, 240 is formed from a plurality of parallel, closely-spaced sets of bondwires. For example, a series inductive element 232 (e.g., series inductor 132, FIG. 1) includes a plurality of bondwires coupled between the first current conducting terminal (e.g., the drain) of transistor 220 and the output lead 204. A shunt inductive element 234 (e.g., shunt inductor 134, FIG. 1) includes a plurality of bondwires coupled between the first current conducting terminal of transistor 220 and a first terminal of a shunt capacitor 242 (e.g., shunt capacitor 142, FIG. 1). Finally, a low-pass matching inductive element 240 (e.g., low-pass matching inductor 140, FIG. 1) is coupled between the output lead 204 and a first terminal of a low-pass matching capacitor 246 (e.g., low-pass matching capacitor 146, FIG. 1). Second terminals of capacitors 242, 246 are coupled to the flange 206 (e.g., to ground) (i.e., capacitors 242, 246 are mounted on flange 206 in the active device area).

An RF cold point is present at the interconnection between shunt inductor 234 and shunt capacitor 242. Envelope frequency termination circuit 249 (e.g., envelope frequency termination circuit 149, FIG. 1) is coupled between the RF cold point and the flange 206 (e.g., to ground). In the device of FIG. 2, envelope frequency termination circuit 249 includes inductive element 236 (e.g., inductance 136, FIG. 1), resistor 238 (e.g., resistor 138, FIG. 1), and capacitor 244 (e.g., capacitor 144, FIG. 1), all coupled in series. Again, envelope inductive element 236 is formed from a plurality of parallel, closely-spaced sets of bondwires. For example, envelope inductive element 236 (e.g., envelope inductance 136, FIG. 1) includes a plurality of bondwires coupled between the first terminal of shunt capacitor 242 and a first terminal of envelope resistor 238 (e.g., envelope resistor 138, FIG. 1). A second terminal of envelope resistor 238 is coupled to a first terminal of an envelope capacitor 244 (e.g., envelope capacitor 144, FIG. 1) through bondwires 239. Thus, bondwires 239 form an additional inductive element in the envelope frequency termination circuit 249 (i.e., the sum of the inductances from bondwires 236 and 239 corresponds to the inductance value of envelope inductance 136, FIG. 1). A second terminal of capacitor 244 is coupled to the flange 206 (e.g., to ground) (i.e., capacitor 244 is mounted on flange 306 in the active device area).

The low frequency resonance (LFR) of an RF device (e.g., device 200) may be simplified (in the case where $C_{ds}$ is much smaller than $C_{shunt}$) as:

$$LFR = \frac{1}{2\pi\sqrt{(L_{env}C_{shunt})}}, \quad \text{(Eqn. 1)}$$

where $L_{env}$ simplifies (since $L_{env}$ is much smaller and in parallel to the inductance of $L_{shunt}$, $L_{series}$, and the bias line inductance) to the inductance value associated with the envelope inductor (e.g., envelope inductance 136 or envelope inductive element 236, FIGS. 1, 2), and $C_{shunt}$ corresponds to the capacitance value associated with the shunt capacitor (e.g., shunt capacitor 142, 242, FIGS. 1, 2). For example, if an LFR of approximately 300 MHz is desired, shunt capacitor 242 may have a value of about 600 pF, and envelope inductive element 236 may have an inductance of about 470 pH.

As mentioned previously, and as discussed in more detail below in conjunction with FIG. 3, an embodiment of a packaged RF amplifier device substantially excludes the inductance associated with envelope inductance 136 (or envelope inductive element 236). Accordingly, with the substantial reduction of the envelope inductance 136, the LFR of a device (e.g., device 300, FIG. 3) may be increased without increasing the value of the shunt capacitor. In particular, as will be described later, an embodiment of a packaged RF amplifier device excludes bondwires in its envelope frequency termination circuit, thus substantially reducing the inductance represented by envelope inductance 136.

Envelope resistor 238 may be, for example, a discrete resistor, a thick film resistor, a thin film resistor, or another type of resistor. Capacitors 242, 244, 246 may be, for example, discrete silicon capacitors, discrete ceramic capacitors, capacitors that are integrally formed with other structures (e.g., with an isolation structure), or other types of capacitors. Bondwires corresponding to inductive elements 234, 236, 240 are attached to conductive top plates at the top surfaces of capacitors 242, 244, 246.

Figure 3:
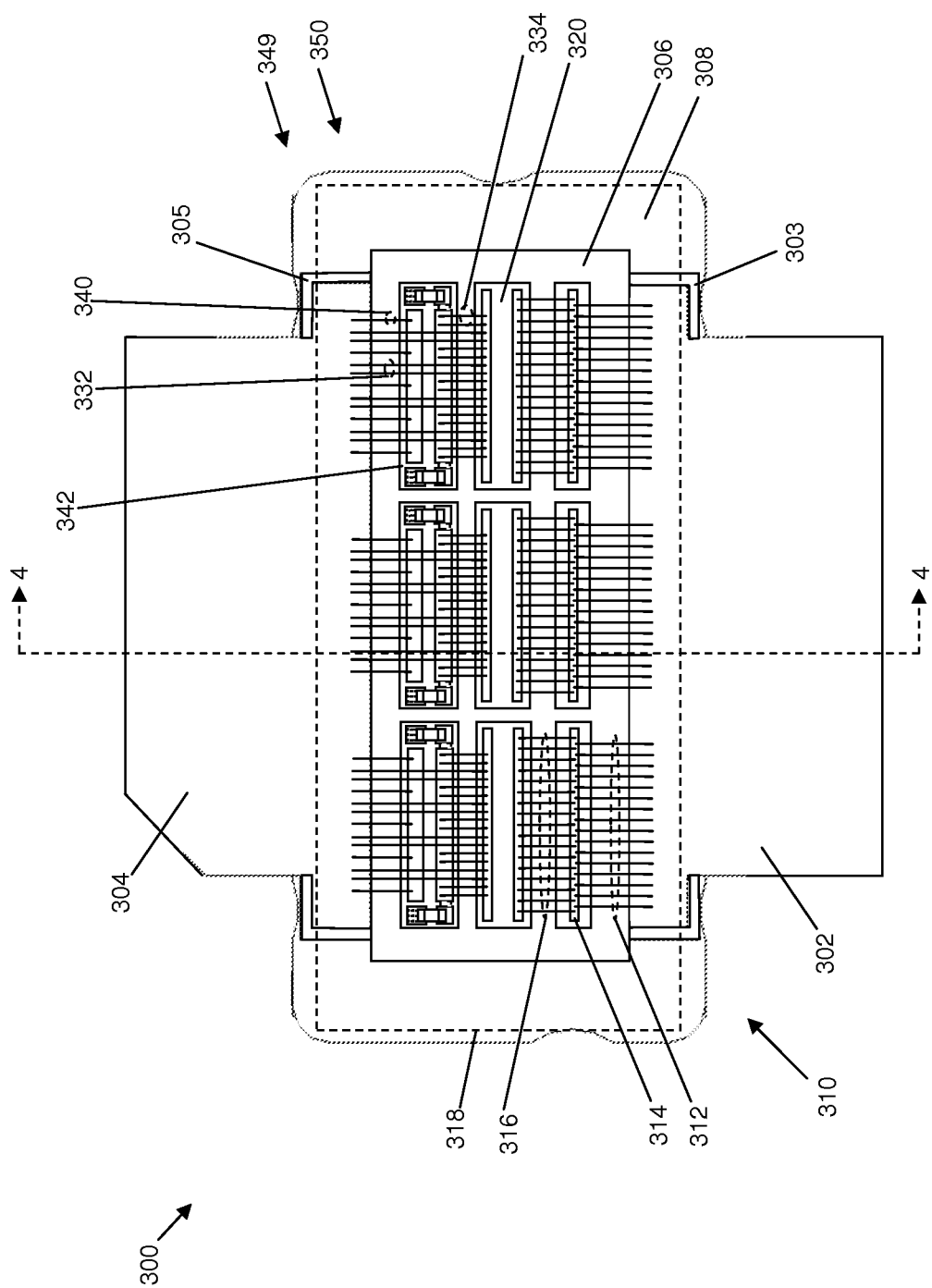
FIG. 3 is a top view of an example of a packaged RF amplifier device that embodies the circuit of FIG. 1 and that includes an integrated passive device (IPD) assembly as part of an output circuit, in accordance with an example embodiment.
Figure 4:
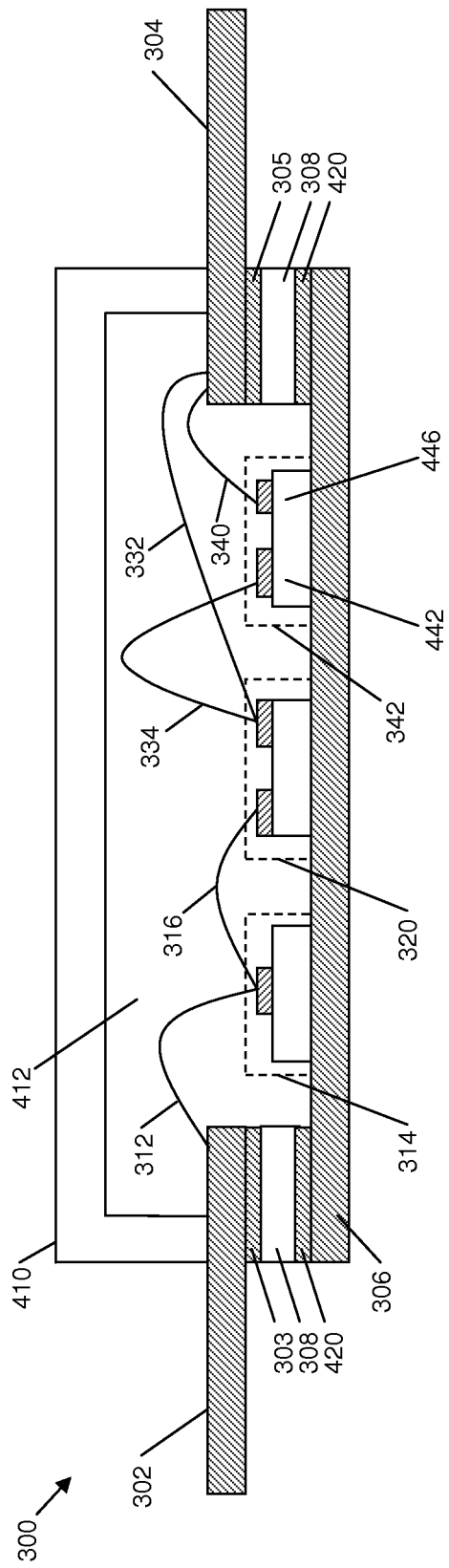
FIG. 4 is a cross-sectional, side view of the RF amplifier device of FIG. 3 along line 4-4.

FIG. 3 is a top view of an example of a packaged RF amplifier device 300 that embodies the circuit of FIG. 1, and that includes an integrated passive device (IPD) assembly 342 as part of an output impedance matching circuit 350 and envelope frequency termination circuit 349, in accordance with an example embodiment. More particularly, the interconnected electrical components and elements of device 300 may be modeled by the schematic diagram of FIG. 1, although with the envelope inductance 136 significantly reduced, when compared with the conventional device 200 of FIG. 2. For enhanced understanding, FIG. 3 should be viewed in conjunction with FIG. 4, which is a cross-sectional, side view of the semiconductor device 300 of FIG. 3 along line 4-4. More specifically, FIG. 4 is a cross-sectional view through input and output leads 302, 304 and the active device area. FIG. 4 also illustrates a cap 410, which may be implemented in air cavity package embodiments to seal the interior components of device 300 within an air cavity 412.

Device 300 includes an input lead 302 (e.g., input lead 102, FIG. 1), an output lead 304 (e.g., output lead 104, FIG. 1), a flange 306, an isolation structure 308, one or more transistors 320 (e.g., transistor 120, FIG. 1), an input impedance matching circuit 310 (e.g., input impedance matching circuit 110, FIG. 1), an envelope frequency termination circuit 349 (e.g., envelope frequency termination circuit 149, FIG. 1), and an output impedance matching circuit 350 (e.g., output impedance matching circuit 150, FIG. 1), all of which may be packaged together as parts of the device. In the example of FIG. 3, device 300 includes three transistors 320 that essentially function in parallel, although another semiconductor device may include one or two transistors or more than three transistors, as well. In addition, device 300 includes three input capacitors 314 and three IPD assemblies 342, which also essentially function in parallel. It is to be understood that more or fewer of capacitors 314 and/or IPD assemblies 342 may be implemented, as well. For purposes of clarity, transistors 320, shunt capacitors 314, and IPD assemblies 342 each may be referred to in the singular sense, below, as will analogous components in other, later-described Figures. It is to be understood that the description of a particular device component in the singular sense applies to the set of all such components. According to an embodiment, jumper wires (not illustrated) may be electrically coupled between the multiple transistors 320, input capacitors 314, and IPD assemblies 342, in order to provide low frequency paths between corresponding components.

According to an embodiment, device 300 is incorporated in an air cavity package, in which transistors 320 and various impedance matching and envelope frequency termination elements 312, 314, 316, 332, 334, 340, and 342 are located within an enclosed air cavity 412. Basically, the air cavity is bounded by flange 306, isolation structure 308, and a cap 410 overlying and in contact with the isolation structure 308 and leads 302, 304. In FIG. 3, an example perimeter of the cap 410 is indicated by dashed box 318. In other embodiments, a device may be incorporated into an overmolded package (i.e., a package in which the electrical components within the active device area are encapsulated with a non-conductive molding compound, and in which portions of the leads 302, 304, and all or portions of the isolation structure 308 also may be encompassed by the molding compound).

Flange 306 includes a rigid electrically-conductive substrate, which has a thickness that is sufficient to provide structural support for electrical components and elements of device 300. In addition, flange 306 may function as a heat sink for transistors 320 and other devices mounted on flange 306. Flange 306 has a top and bottom surface (only a central portion of the top surface is visible in FIG. 3), and a substantially-rectangular perimeter that corresponds to the perimeter of the device 300 (e.g., to the perimeter of isolation structure 308, described below).

Flange 306 is formed from a conductive material, and may be used to provide a ground reference for the device 300. For example, various components and elements may have terminals that are electrically coupled to flange 306, and flange 306 may be electrically coupled to a system ground when the device 300 is incorporated into a larger electrical system. At least the surface of flange 306 is formed from a layer of conductive material, and possibly all of flange 306 is formed from bulk conductive material. Alternatively, flange 306 may have one or more layers of non-conductive material below its top surface. Either way, flange 306 has a conductive top surface. Flange 306 may more generally be referred to as a substrate with a conductive surface.

Isolation structure 308 is attached to the top surface of flange 306. For example, isolation structure 308 may include a layer of metallization 420 on its bottom surface, which may be soldered to or otherwise attached to the top surface of flange 306. Isolation structure 308 is formed from a rigid, electrically insulating material (i.e., a material with a dielectric constant in a range from about 3.0 to about 10.0, although materials with higher or lower dielectric constants may be used), and has a top surface and an opposed bottom surface. The term "isolation structure," as used herein, refers to a structure that provides electrical isolation between conductive features of a device (e.g., between leads 302, 304 and flange 306). For example, isolation structure 308 may be formed from inorganic materials (e.g., ceramic such as aluminum oxide, aluminum nitride, and so on) and/or organic materials (e.g., one or more polymers or printed circuit board (PCB) materials). In an embodiment in which isolation structure 308 comprises PCB materials (e.g., the isolation structure 308 essentially includes a single or multi-layer PCB), conductive layers (e.g., copper layers) may be included on the top and bottom surfaces of the isolation structure. In a further embodiment, a conductive layer on the top surface of the isolation structure 308 may be patterned and etched to form a leadframe (including leads 302, 304) for the device 300, and a conductive layer on the bottom surface of the isolation structure 308 may be coupled to the flange 306. In other embodiments, conductive layers may be excluded from the top and/or bottom surface of the isolation structure 308. In such embodiments, leads (e.g., leads 302, 304) may be coupled to the isolation structure 308 using epoxy (or other adhesive materials), and/or the isolation structure 308 may be coupled to the flange 306 using epoxy (or other adhesive materials). In still other embodiments, the isolation structure 308 may be milled at the portion of its top surface to which a lead is attached.

Isolation structure 308 has a frame shape, in an embodiment, which includes a substantially enclosed, four-sided structure with a central opening. Isolation structure 308 may have a substantially rectangular shape, as shown in FIG. 3, or isolation structure 308 may have another shape (e.g., annular ring, oval, and so on). Isolation structure 308 may be formed as a single, integral structure, or isolation structure 308 may be formed as a combination of multiple members. For example, in an alternate embodiment, isolation structure 308 may include multiple portions that contact each other or that are spatially separated from each other (e.g., isolation structure 308 may have one portion isolating input lead 302 from flange 306, and another portion isolating output lead 304 from flange 306). In an embodiment in which isolation structure 308 includes multiple, spatially separated portions, the "central opening" in isolation structure 308 is considered to be the space between the multiple, spatially separated portions. In addition, isolation structure 308 may be formed from a homogenous material, or isolation structure 308 may be formed from multiple layers.

The input and output leads 302, 304 are mounted on a top surface of the isolation structure 308 on opposed sides of the central opening, and thus the input and output leads 302, 304 are elevated above the top surface of the flange 306, and are electrically isolated from the flange 306. For example, the input and output leads 302, 304 may be soldered or otherwise attached to metallization 303, 305 on a top surface of isolation structure 308. The metallization 303, 305 may be considered to be conductive pads to which the input and output leads 302, 304 are coupled. Generally, the input and output leads 302, 304 are oriented in order to allow for attachment of bondwires (e.g., bondwires 312, 332, 340) between the input and output leads 302, 304 and components and elements within the central opening of isolation structure 308.

Transistors 320 and various elements 314, 342 of the input and output impedance matching circuits 310, 350 and envelope frequency termination circuits 349 are mounted on a generally central portion of the top surface of a flange 306 that is exposed through the opening in isolation structure 308. According to an embodiment, transistors 320 are positioned within the active device area of device 300, along with impedance matching and envelope frequency termination elements 314, 342. For example, the transistors 320, capacitors 314, and IPD assemblies 342 may be coupled to flange 306 using conductive epoxy, solder, solder bumps, sintering, and/or eutectic bonds.

Each transistor 320 has a control terminal (e.g., a gate) and two current conducting terminals (e.g., a drain and a source). The control terminal of each transistor 320 is coupled to the input impedance matching circuit 310 (e.g., through bondwires 316 between input capacitor 314 and transistor 320). In addition, one current conducting terminal (e.g., the drain) is coupled to the output impedance matching circuit 350 (e.g., through bondwires 334 between transistor 320 and capacitor 342) and to the output lead 304 (e.g., through bondwires 332 between transistor 320 and output lead 304). The other current conducting terminal (e.g., the source) is coupled to the flange 306 (e.g., to ground), in an embodiment.

The input impedance matching circuit 310 (e.g., input impedance matching circuit 110, FIG. 1) is coupled between the input lead 302 (e.g., input lead 102, FIG. 1) and the control terminal of the transistor 320 (e.g., transistor 120, FIG. 1). In the device 300 of FIG. 3, the input impedance matching circuit 310 includes two inductive elements 312, 316 (e.g., inductive elements 112, 116, FIG. 1) and a capacitor 314 (e.g., capacitor 114, FIG. 1). Each inductive element 312, 316 is formed from a plurality of parallel, closely-spaced sets of bondwires, in an embodiment. For example, a first inductive element 312 (e.g., inductive element 112, FIG. 1) includes a plurality of bondwires coupled between input lead 302 and a first terminal of capacitor 314 (e.g., capacitor 114, FIG. 1), and a second inductive element 316 (e.g., inductive element 116, FIG. 1) includes a plurality of bondwires coupled between the first terminal of capacitor 314 and the control terminal of transistor 320. The second terminal of capacitor 314 is coupled to the flange 306 (e.g., to ground). Capacitor 314 may be, for example, a discrete silicon capacitor, a discrete ceramic capacitor, or another type of capacitor. Bondwires 312, 316 are attached to a conductive top plate at the top surface of capacitor 314.

The output impedance matching circuit 350 (e.g., output impedance matching circuit 150, FIG. 1) is coupled between a first current conducting terminal (e.g., drain) of transistor 320 (e.g., transistor 120, FIG. 1) and the output lead 304 (e.g., output lead 104, FIG. 1). In the device 300 of FIG. 3, the output impedance matching circuit 350 includes three inductive elements 332, 334, 340 (e.g., inductors 132, 134, 140, FIG. 1) and two capacitors 442, 446 (e.g., capacitors 142, 146, FIG. 1). As is more clearly indicated in FIG. 4, the capacitors 442, 446 of output impedance matching circuit 350 are included in IPD assembly 342, according to an embodiment. These capacitors 442, 446 will be illustrated and described in more detail in conjunction with FIGS. 5 and 6. In an embodiment in which low-pass matching circuit 147 is excluded, IPD assembly 342 may exclude capacitor 446 (e.g., capacitor 146, FIG. 1).

Again, each inductive element 332, 334, 340 is formed from a plurality of parallel, closely-spaced sets of bondwires, in an embodiment. For example, a series inductive element 332 (e.g., series inductor 132, FIG. 1) includes a plurality of bondwires coupled between the first current conducting terminal (e.g., the drain) of transistor 320 and the output lead 304. A shunt inductive element 334 (e.g., shunt inductor 134, FIG. 1) includes a plurality of bondwires coupled between the first current conducting terminal of transistor 320 and a first terminal of a shunt capacitor 442 (e.g., shunt capacitor 142, FIG. 1). A low-pass matching inductive element 340 (e.g., low-pass matching inductor 140, FIG. 1) is coupled between the output lead 304 and a first terminal of low-pass matching capacitor 446 (e.g., low-pass matching capacitor 146, FIG. 1). Second terminals of capacitors 442, 446 are electrically connected to the flange 306 (e.g., to ground). Bondwires corresponding to inductive elements 334, 340 are attached to conductive top plates at the top surfaces of capacitors 342, 346. Referring to FIG. 4, it is notable that the inductive coupling between bondwires 332 and 334 is related to the area underneath both sets of bondwires 332, 334 (e.g., the larger the area, the higher the inductive coupling, and vice versa). In order to reduce that area, bondwires 332 are desirably as short as possible, while still ensuring that bondwires 332 are a reasonable distance above bondwires 340. Essentially, the height of bondwires 340 determines the height of bondwires 332.

As will be explained in more detail in conjunction with FIGS. 5, 7, and 8, in contrast with the embodiment illustrated in FIG. 2, elements of the envelope frequency matching circuit 349 (i.e., envelope resistor 538 and envelope capacitor 544) are included as portions of the IPD assembly 342. In other words, instead of including discrete components that are mounted on flange 306 in the active device area, the envelope resistor (e.g., envelope resistor 538 and envelope capacitor 544 are located in or on IPD assembly 342, and are electrically coupled with the rest of the output impedance matching circuit 350 through additional conductive features. In addition, as will be clarified in more detail below, the inclusion of multiple IPD assemblies 342 with parallel-coupled envelope frequency termination circuits enables the values of each of the envelope frequency termination circuit components to be reduced, when compared with the conventional approach of FIG. 2, which included only one relatively high value envelope frequency termination resistor 238 and one relatively high value envelope frequency termination capacitor 244. This may result in better performance and lower manufacturing costs.

Figure 5:
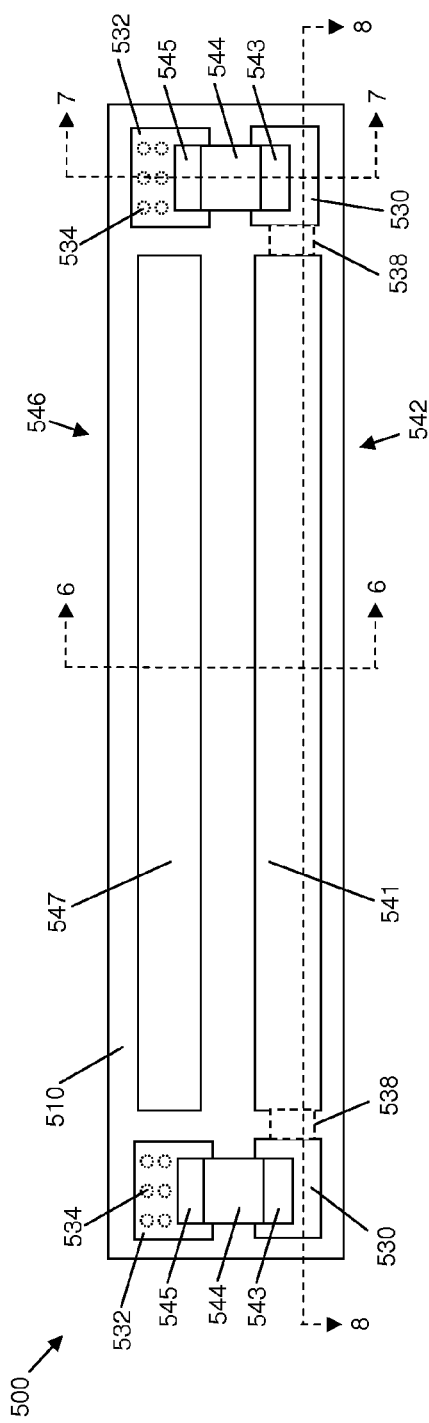
FIG. 5 is a top view of an IPD assembly suitable for use in an output circuit in a packaged RF amplifier device, in accordance with an example embodiment.

FIG. 5 is a top view of an IPD assembly 500 (e.g., IPD assembly 342, FIG. 3) suitable for use in an output circuit (e.g., an out impedance matching circuit 150, 350 and envelope frequency termination circuit 149, 345, FIGS. 1, 3) in a packaged RF amplifier device (e.g., device 300, FIG. 3), in accordance with an example embodiment. For enhanced understanding, FIG. 5 should be viewed in conjunction with FIGS. 6-8, which illustrate cross-sectional, side views of IPD assembly 500 along lines 6-6, 7-7, and 8-8, respectively.

According to an embodiment, IPD assembly 500 includes a shunt capacitor 542 (e.g., capacitor 142, FIG. 1), an envelope capacitor 544 (e.g., capacitor 144, FIG. 1), an envelope resistor 538 (e.g., resistor 138, FIG. 1), and a low frequency matching capacitor 546 (e.g., capacitor 146, FIG. 1). More particularly, in an embodiment, shunt capacitor 542, envelope resistor 538, and low frequency matching capacitor 546 are integrally formed in an IPD 510, and envelope capacitor 544 is a discrete component that is mounted on a surface of the IPD 510. In an alternate embodiment, envelope capacitor 544 also may be integrated into IPD 510. In an embodiment in which low-pass matching circuit 147 is excluded (e.g., the embodiment illustrated in FIG. 9), IPD assembly 500 may exclude low frequency matching capacitor 546 (e.g., capacitor 146, FIG. 1).

IPD 510 includes a semiconductor substrate 610 with top and bottom surfaces 612, 614. The semiconductor substrate 610 may be formed from any of a variety of semiconductor materials, including but not limited to silicon, gallium arsenide, gallium nitride, and so on. A plurality of conductive layers 620, 622 and insulating layers 626, 628 are formed over the top surface 612 of the substrate 610, and an additional conductive layer 624 is formed on the bottom surface 614 of the substrate 612 to facilitate electrical attachment to an underlying substrate (e.g., flange 306), according to an embodiment. For example, conductive layer 624 may be a gold (or other metal) layer, which facilitates forming a eutectic bond between IPD 510 and a separate conductive substrate (e.g., flange 306, FIG. 3). Alternatively, conductive layer 624 may be a metal layer, which facilitates sintering (e.g., silver sintering) IPD 510 to the separate conductive substrate. The insulating layers 626 function to selectively electrically isolate the conductive layers 620, 622.

Figure 6:
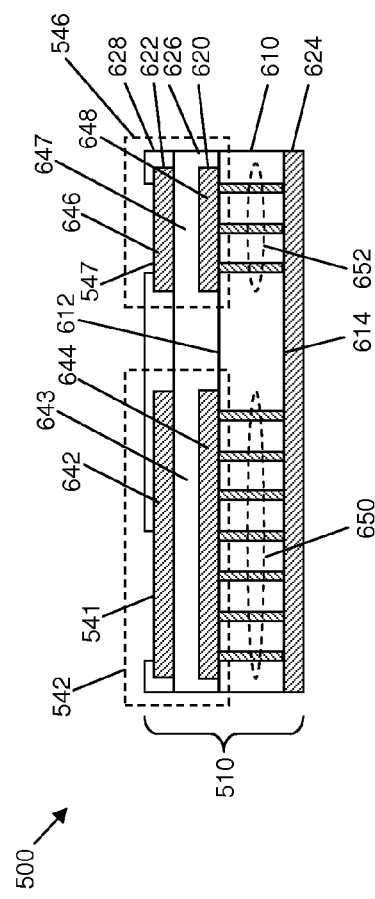
FIG. 6 is a cross-sectional, side view of the IPD assembly of FIG. 5 along line 6-6.

Referring to FIGS. 5 and 6, and as mentioned above, IPD 510 includes a shunt capacitor 542 (e.g., capacitor 142, FIG. 1) and a low frequency matching capacitor 546 (e.g., capacitor 146, FIG. 1), in an embodiment. For example, shunt capacitor 542 may have a value in a range between about 50 pF to about 500 pF, and low-pass matching capacitor 146 may have a value in a range between about 1 pF to about 50 pF, although the capacitance values may be lower or higher, in other embodiments.

According to an embodiment, shunt capacitor 542 and low frequency matching capacitor 546 each are implemented as metal-insulator-metal (MIM) capacitors (e.g., with parallel metal plates electrically separated by a thin dielectric (e.g., a thin nitride or oxide). Accordingly, in an embodiment, shunt capacitor 542 includes a top capacitor electrode 642 formed from a portion of conductive layer 622, a bottom capacitor electrode 644 formed from a portion of conductive layer 620 and vertically aligned with the top capacitor electrode 642, and dielectric material 643 formed from a portion of insulating layer 626. Similarly, low frequency matching capacitor 546 includes a top capacitor electrode 646 formed from a portion of conductive layer 622, a bottom capacitor electrode 648 formed from a portion of conductive layer 620 and vertically aligned with the top capacitor electrode 646, and dielectric material 647 formed from a portion of insulating layer 626.

According to an embodiment, IPD 510 also includes first and second sets of conductive through substrate vias (TSVs) 650, 652 extending between the top and bottom surfaces 612, 614 of substrate 610. The first set of TSVs 650 is electrically coupled to the bottom capacitor electrode 644 of shunt capacitor 542, and the second set of TSVs 652 is electrically coupled to the bottom capacitor electrode 648 of low frequency matching capacitor 546. In addition, both the first and second sets of TSVs 650, 652 are electrically coupled to the conductive layer 624 on the bottom surface 614 of the substrate 610. In an alternate embodiment, conductive pads or balls may be coupled to the ends of the TSVs 650, 652 that are coplanar with the bottom surface 614 of the substrate 610, rather than being electrically coupled to conductive layer 624. In yet another alternate embodiment, TSVs 650 and/or 652 may be replaced by edge plating or castellations on the side surface(s) of IPD 510, which extend between the top and bottom surfaces of substrate 610.

To facilitate interconnection of shunt capacitor 542 and low frequency matching capacitor 546 to external circuitry (e.g., to transistor 120, 320 and/or output lead 104, 304, FIGS. 1, 3), IPD 510 also includes contact pads 541, 547 exposed at its top surface. According to an embodiment, each contact pad 541, 547 is configured to accept attachment of one or more bondwires (e.g., bondwires 334, 340). The contact pads 541, 547 may be formed from the same conductive layer 622 as top electrodes 642, 646, as illustrated in FIG. 6, or the contact pads 541, 547 may be formed from different conductive layers than top electrodes 642, 646. When IPD assembly 500 is incorporated into an RF amplifier device such as RF amplifier device 100 or 300, contact pad 541 corresponds to the RF cold point, or to node 148 of FIG. 1.

Although the electrodes 642, 644, 646, 648 of the shunt and low frequency matching capacitors 542, 546 are illustrated as being formed from portions of the same conductive layers (i.e., layers 620, 622), the electrodes 642, 644, 646, 648 of capacitors 542, 546 may be formed from portions of different layers from each other and/or from different layers than those depicted in FIG. 6 (e.g., one or more other conductive layers, not illustrated, may be present below or above the conductive layers 620, 622 from which capacitors 542, 546 are formed). In addition, although each of capacitors 542, 546 are illustrated as simple parallel plate capacitors consisting of a single top electrode and a single bottom electrode, either or both of capacitors 542, 546 could have other types of capacitor structures, as well (e.g., the electrodes could consist of multiple, interleaved conductive structures, and so on).

Figure 7:
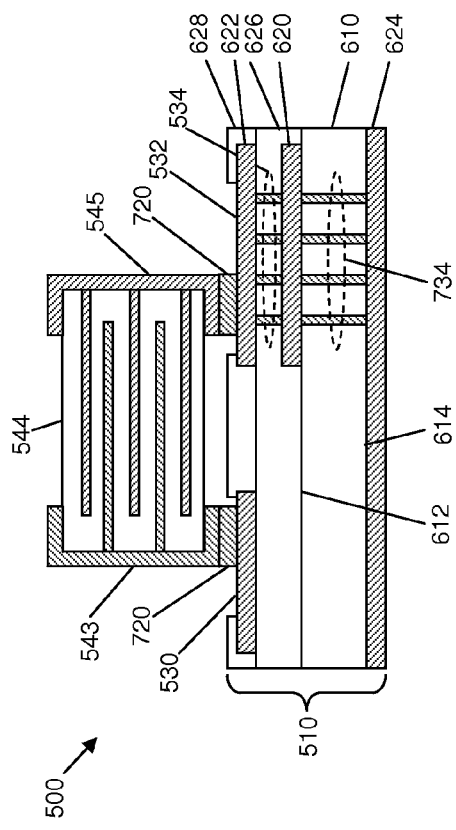
FIG. 7 is a cross-sectional, side view of the IPD assembly of FIG. 5 along line 7-7.
Figure 8:
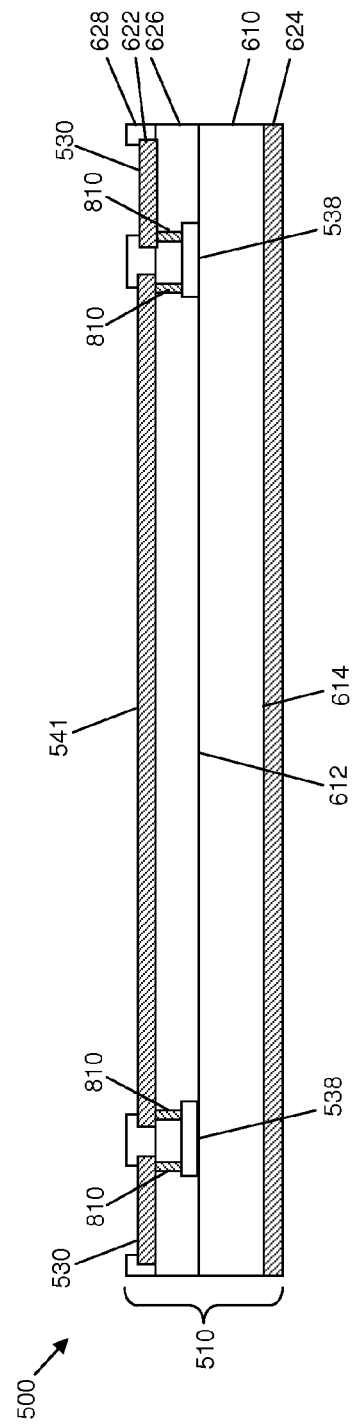
FIG. 8 is a cross-sectional, side view of the IPD assembly of FIG. 5 along line 8-8.

Referring now to FIGS. 5, 7, and 8, and as mentioned above, IPD assembly 500 also includes one or more series-coupled envelope frequency termination circuits (e.g., envelope frequency termination circuit 149, FIG. 1). In the illustrated embodiment, IPD assembly 500 includes two series coupled circuits, each including an envelope resistor 538 (e.g., resistor 138, FIG. 1), an envelope capacitor 544 (e.g., capacitor 144, FIG. 1), and a relatively small envelope inductance (e.g., inductance 136, FIG. 1) composed of a combination of small series inductances from contact pads 541, 530, 532, and vias 534, 734, 810. The two circuits are positioned at and electrically connected to opposite ends of contact pad 541 (or RF cold point node 148), and the two circuits are coupled in parallel between contact pad 541 and conductive layer 624 (or the ground reference point). With the placement of multiple, parallel-coupled envelope frequency termination circuits on each side of contact pad 541, the overall envelope frequency termination circuit is much more uniformly fed, and the values of the individual components comprising each parallel-coupled envelope frequency termination circuit may be reduced (due to the parallel-coupling) when compared with conventional devices. In particular, referring again to the conventional device 200 illustrated in FIG. 2, although multiple die 220 and matching circuits 250 results in an increase in the value of Cshunt (i.e., shunt capacitor 244), the envelope inductance (due to wirebonds 236, 239) did not decrease. Accordingly, in the conventional device 200, the ISBW cannot scale with power. Conversely, in devices (e.g., device 300) that include envelope frequency termination circuits configured in accordance with the various embodiments, the ISBW may be scaled with power. As will be explained in more detail later, in other embodiments, the envelope frequency termination circuit may include only one series-coupled circuit (e.g., only one capacitor 544 and one resistor 538) or more than two series-coupled circuits (e.g., more than two capacitors 544 and resistors 538).

According to an embodiment, the total capacitance of the envelope capacitor(s) 544 coupled between contact pad 541 and conductive layer 624 may be in a range of about 10 nF to about 1 µF, although the capacitance value may be lower or higher, in other embodiments. In addition, according to an embodiment, envelope capacitor(s) 544 have a relatively high voltage rating (e.g., between about 50 and about 150 volts, although the voltage rating may be higher or lower, in other embodiments). Further, the total resistance value of the envelope resistor(s) 538 coupled between contact pad 541 and conductive layer 624 may be in a range of about 0.1 Ohm to about 2 Ohm, although the resistance value may be lower or higher, in other embodiments.

As illustrated in FIG. 8, envelope resistor 538 may be integrated as part of IPD 510. For example, envelope resistor 538 may be a polysilicon resistor formed from a layer of polysilicon overlying semiconductor substrate 610, and electrically coupled between contact pads 541 and 530 through vias 810 (and possibly other conductive layers, not shown). In other alternate embodiments, envelope resistor 538 may be formed from tungsten silicide or another material, may be a thick or thin film resistor, or may be a discrete component coupled to a top surface of IPD 510.

As illustrated in FIG. 7, envelope capacitor 544 may be, for example, a discrete capacitor that is connected (e.g., using solder 720, a conductive epoxy, or other means) to a top surface of IPD 510. More specifically, a first terminal 543 of capacitor 544 may be connected to a first contact pad 530 that is exposed at a top surface of the IPD 510, and a second terminal 545 of capacitor 544 may be connected to a second contact pad 532 that is exposed at the top surface of the IPD 510. Contact pads 530, 532 may, for example, be formed from the same conductive layer 622 as contact pads 541, 547, although they may be formed from other conductive layers, as well. Referring also to FIG. 1, contact pads 530, 532 correspond to nodes 151, 153, respectively, of envelope frequency termination circuit 149.

According to an embodiment, IPD 510 also includes first and second sets of vias 534, 734, which electrically connect contact pad 532 to conductive layer 624 (e.g., to the ground reference node). The first set of vias 534 represent conductive through-hole vias that extend between conductive layers 620, 622 over substrate 610. Although vias 534 are shown to interconnect only a single pair of conductive layers 620, 622, additional vias may be used when IPD 510 includes more than two conductive layers 620, 622 overlying substrate 610. In any event, vias 534 essentially provide electrical connectivity between contact pad 532 and the top surface 612 of substrate 610. The second set of vias 734 are TSVs, which provide for electrical connectivity between the top and bottom surfaces 612, 614 of substrate 610. In an embodiment, TSVs 734 are coupled to the conductive layer 624 on the bottom surface of substrate 610. Accordingly, the combination of vias 534, 734 and conductive layers 620, 622 electrically connects contact pad 532 (and the second terminal 545 of capacitor 544) with the conductive layer 624 on the bottom surface 614 of the substrate 610. In an alternate embodiment, conductive pads or balls may be coupled to the ends of the TSVs 734 that are coplanar with the bottom surface 614 of the substrate 610, rather than being electrically coupled to conductive layer 624. In yet another alternate embodiment, vias 534 and/or 734 may be replaced by edge plating or castellations on the side surface(s) of IPD 510, which extend between the top and bottom surfaces of IPD 510.

As illustrated in FIG. 7, capacitor 544 may be a multiple-layer capacitor (e.g., a multiple-layer ceramic capacitor) with parallel, interleaved electrodes and wrap-around end terminations 543, 545. Alternatively, capacitor 544 may form a portion of a separate IPD (e.g., a MIM capacitor formed on a semiconductor substrate), or may be another capacitor (e.g., a trench or other type of capacitor) formed within IPD 510. Alternatively, capacitor 544 may be implemented as another type of capacitor capable of providing the desired capacitance and voltage for the envelope frequency termination circuit.

The embodiment illustrated in FIG. 5, includes two series-coupled circuits positioned proximate to opposite sides of IPD 510, with each including an envelope resistor 538 and an envelope capacitors 544. In other embodiments, IPD assembly 500 may have only one series-coupled circuit with one envelope resistor and one envelope capacitor, or may have more than two of such series coupled circuits. In addition, each of envelope resistor 538 and envelope capacitor 544 may be implemented as multiple components (coupled in series and/or in parallel), and/or the series arrangement may be different (e.g., envelope capacitor 544 may be coupled to contact pad 541 (or to RF cold point node 148), and envelope resistor 538 may be coupled between envelope capacitor 544 and conductive layer 624 (or the ground reference point)). Further, the series-coupled envelope resistor and envelope capacitor circuit(s) may be located at different positions on the IPD 510.

Referring again to FIG. 5, although IPD 510 is illustrated as including only two conductive layers 620, 622 and two insulating layers 626, 628 overlying the top surface 612 of substrate 610, alternate embodiments of an IPD that provides substantially the same functionality may include more than two conductive and/or insulating layers 620, 622, 626, 628. In addition, although IPD assembly 500 illustrates an embodiment that includes one shunt capacitor 542, two envelope capacitors 544, two envelope resistors 538, and one low frequency matching capacitor 546, alternate embodiments may include more than one shunt and/or low frequency matching capacitor 542, 546 (e.g., with sets of the same type of capacitor being arranged in parallel or series), and/or one or more than two envelope capacitors 544 and/or envelope resistors 538. In addition, although FIG. 5 illustrates a layout in which the shunt and low frequency matching capacitors 542, 546 are arranged in the center of the IPD assembly 500, and the two envelope capacitors 544 and envelope resistors 538 are arranged at ends of the IPD assembly 500, the various components may be arranged differently, in other embodiments (e.g., the shunt and/or low frequency matching capacitor 542, 546 may be at one or both ends, and one or more of the envelope capacitors 544 and/or envelope resistors 538 may be in the center).

An advantage to the embodiments of FIGS. 5-8 is that the significant inductance 136 (FIG. 1) previously present in a device (e.g., device 200, FIG. 1) with a conventional envelope frequency termination circuit 149 has been significantly reduced. The only remaining envelope inductance is a negligible amount of inductance (e.g., <100 pH) associated with contact pads 541, 530, 532, and vias 534, 734, 810. The significant reduction of the envelope inductance 136 may improve performance by increasing the low frequency resonance frequency of device 300. For example, referring again to Equation 1, above, when the total shunt capacitance has a value of about 600 pF, and the total envelope inductance has been reduced to about 100 pH according to the various embodiments, the LFR of device 300 may be about 600 MHz (or even higher for even lower envelope inductances). This represents a significant increase in LFR, when compared with the LFR achievable using a conventional device (e.g., an LFR of about 300 MHz according to the previous example).

Each of the previously-discussed and illustrated embodiments corresponds to a two-lead device (e.g., devices having an input lead 304 and an output lead 306, FIG. 3). Such a device may be incorporated into a larger electrical system by physically coupling the device to a printed circuit board (PCB), electrically connecting the input lead to a signal source, and electrically connecting the output lead to a load. The PCB may further include one or more bias feeds (e.g., each with a length of lambda/4 or some other length) with proximal ends located close to the PCB connection(s) to the output lead and/or input lead. A blocking capacitor at the distal end of each bias lead may provide a short at a given RF frequency, which when transformed through the bias lead, appears as an open circuit.

Figure 9:
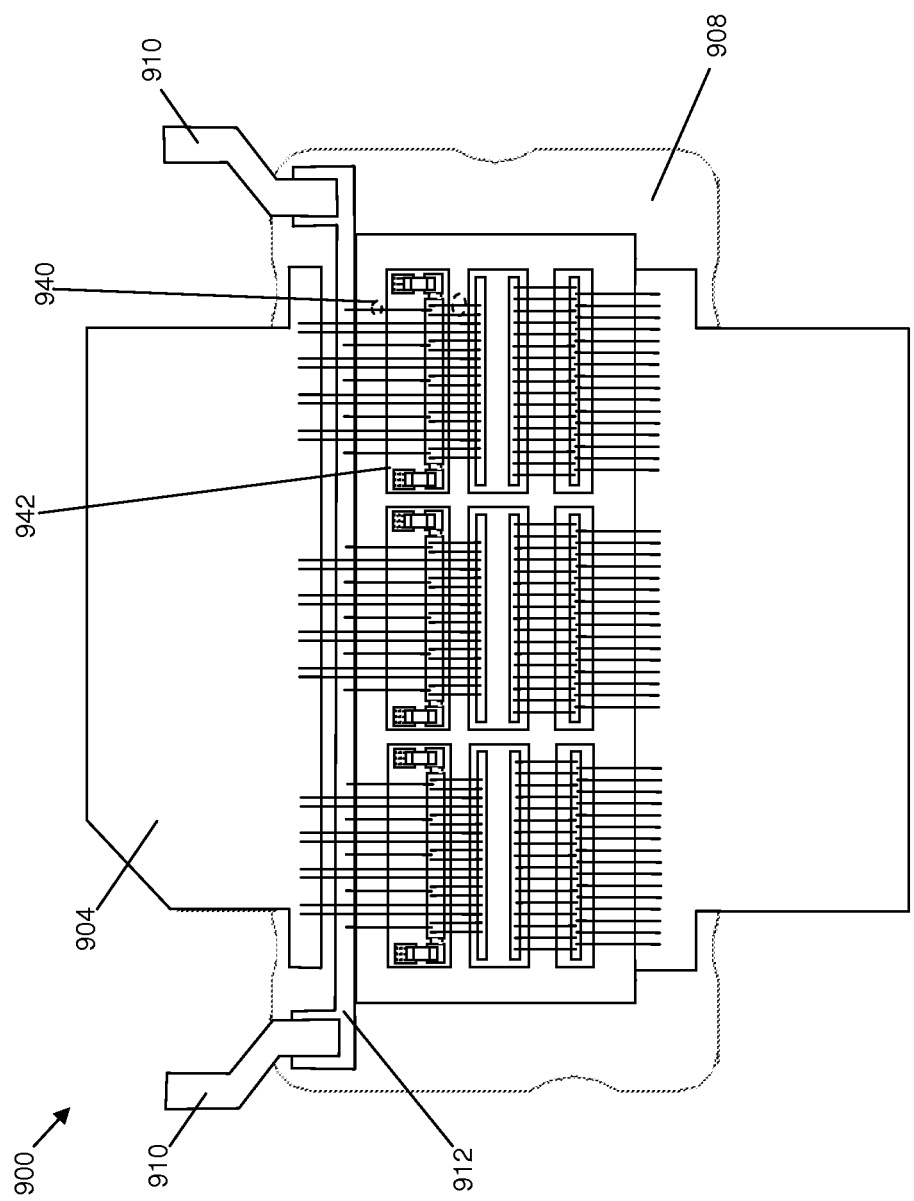
FIG. 9 is a top view of an example of a packaged RF amplifier device that embodies the circuit of FIG. 1 and that includes an IPD assembly and bias leads, in accordance with another example embodiment.

Other embodiments include devices with bias leads formed as integral portions of the device, and additional conductive features that coupled the bias leads with the impedance matching network(s). For example, another embodiment includes a four-lead device, in which two bias leads are coupled to the output impedance matching circuit. To illustrate such an embodiment, FIG. 9 is provided, which is a top view of an example of a packaged RF amplifier device 900 that embodies the circuit of FIG. 1 and that includes multiple IPD assemblies 942 and bias leads 910, in accordance with another example embodiment. Except for the inclusion of bias leads 910 and the exclusion of low frequency matching capacitors in the output impedance matching circuits (e.g., capacitors 146, 546, FIGS. 1, 5), the device 900 of FIG. 9 is similar to device 300 (FIG. 3). For the purpose of brevity, the similar features are not repeated here.

According to an embodiment, bias leads 910 are coupled to a top surface of isolation structure 908, and are electrically coupled together with a bar-shaped conductor 912, which also is coupled to the top surface of isolation structure 908. According to a particular embodiment, conductor 912 includes metallization on a top surface of isolation structure 908. More particularly, conductor 912 is located on a portion of isolation structure 908 that extends toward the active device area beyond the edge of output lead 904. Conductor 912 extends adjacent to and in parallel with the edge of output lead 904, and the conductor 912 is electrically isolated from the output lead 904. The length (horizontal dimension, in FIG. 9) of conductor 912 is greater than the length of the edge of output lead 904, in an embodiment. Proximal ends of bias leads 910 are coupled to opposite ends of conductor 912, in an embodiment. Bondwires 940 are electrically coupled between conductor 912 and the shunt capacitor of IPD assembly 942 (e.g., capacitor 542, FIG. 5).

Bias leads 910 extend from the device 900, once packaged, so that their distal ends are exposed and may be coupled to a PCB of a larger system to receive a bias voltage. Accordingly, inclusion of bias leads 910 eliminates the need for bias leads on the PCB itself. According to an embodiment, each bias lead 910 has a length corresponding to lambda/4, although each bias lead 910 may have a different length, as well. An advantage of including bias leads 910 as part of device 900 is that the bias leads 910 remove the need for quarter wave bias feeds, as additional large value decoupling capacitors may be connected between the bias leads 910 and ground as the bias leads 910 exit the device package.

Another embodiment may include a four-lead device with two bias leads coupled to the input impedance matching circuit. Yet another embodiment includes a six-lead device with two bias leads coupled to the output impedance matching circuit and two bias leads coupled to the input impedance matching circuit. In still other embodiments, only a single bias lead may be coupled to the input and/or output impedance matching circuits (e.g., particularly for embodiments in which there are more than two RF leads, such as in dual-path and multi-path devices).

Figure 10:
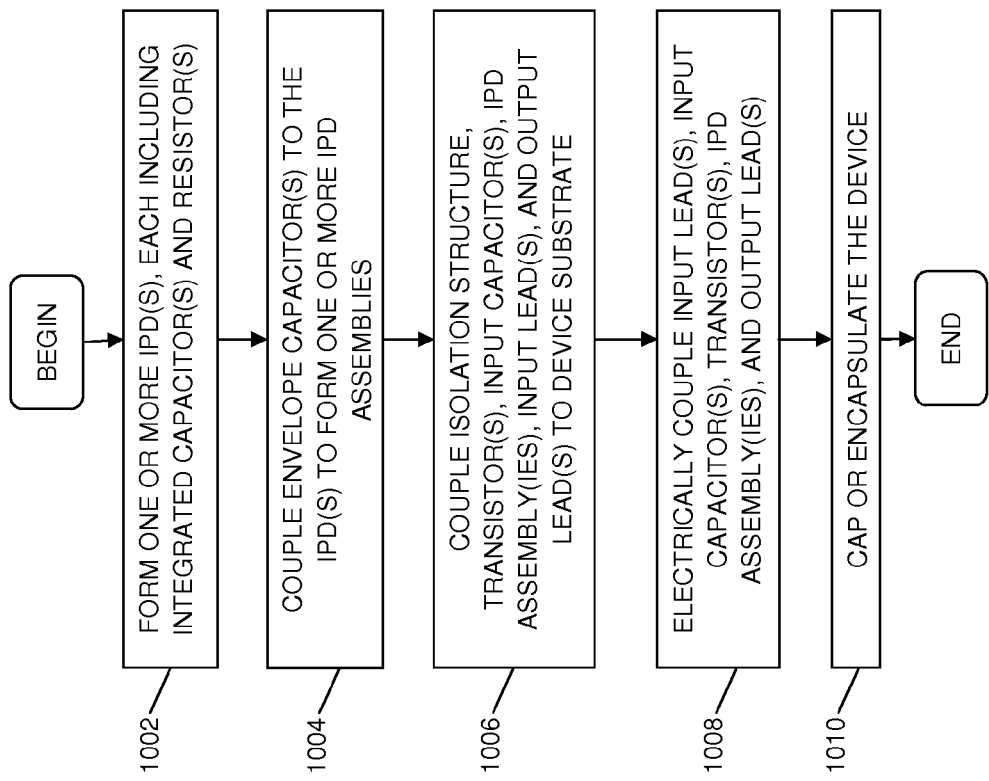
FIG. 10 is a flowchart of a method of manufacturing a packaged RF device with an IPD assembly, in accordance with an example embodiment.

FIG. 10 is a flowchart of a method of manufacturing a packaged RF device (e.g., device 300, FIG. 3) with one or more IPD assemblies (e.g., IPD assembly 342, 500, FIGS. 3, 5-8), in accordance with an example embodiment. The method may begin, in blocks 1002 and 1004, by forming one or more IPD assemblies. For example, in block 1002, one or more IPDs (e.g., IPD 510, FIG. 5) may be formed, each of which includes one or more integrated capacitors (e.g., shunt capacitor 542 and low frequency matching capacitor 546, FIGS. 5, 6), and one or more envelope resistors (e.g., resistors 538, FIGS. 5, 8). In alternate embodiments, each IPD may exclude the low frequency matching capacitor and/or the envelope resistor(s) (e.g., the envelope resistor(s) may be implemented as discrete components later mounted to each IPD). In addition, in another embodiment, the IPD also may include one or more integrated high-capacitance, high-voltage envelope capacitors. In addition to forming the passive components of each IPD, forming each IPD also includes forming various conductive features (e.g., conductive layers and vias), which facilitate electrical connection between the various components of each IPD assembly.

In block 1004, in embodiments in which the envelope capacitor is not integrated with the IPD, one or more discrete, high-voltage, high-capacitance envelope capacitors (e.g., capacitors 544, FIGS. 5, 7) are coupled to each IPD in series with the envelope resistor(s). As described previously, this results in the formation of one or more IPD assemblies, each of which includes at least a shunt capacitor (e.g., capacitor 542) and one or more envelope frequency termination circuit(s) coupled in parallel between a node (e.g., node 148, FIG. 1, corresponding to contact pad 541 and an RF cold point) and a ground reference (e.g., conductive layer 624, FIG. 6).

In block 1006, for an air cavity embodiment, an isolation structure (e.g., isolation structure 308, FIG. 3) is coupled to a device substrate (e.g., flange 306). In addition, one or more active devices (e.g., transistors 320), input impedance matching circuit elements (e.g., capacitors 314), and IPD assemblies (e.g., IPD assemblies 324, 500) are coupled to a portion of the top surface of the substrate that is exposed through an opening in the isolation structure (e.g., the active device area). Leads (e.g., input and output leads 302, 304, and bias leads) are coupled to the top surface of the isolation structure (e.g., to metallization on the top surface of the isolation structure). In an alternate embodiment, a conductive layer on the top surface of the isolation structure may be patterned and etched to form a leadframe (e.g., prior to coupling the isolation structure to the flange). For overmolded (e.g., encapsulated) device embodiments, the isolation structure may be excluded, and the substrate and leads may form portions of a leadframe.

In block 1008, the input lead(s), input capacitor(s), transistor(s), IPD assembly(ies), and output lead(s) are electrically coupled together. For example, the electrical connections may be made using bondwires between the various device components and elements, as discussed previously. Finally, in block 1010, the device is capped (e.g., with cap 410) or encapsulated (e.g., with mold compound, not illustrated). The device may then be incorporated into a larger electrical system.

An embodiment of a device assembly includes an IPD with a first capacitor, and a second capacitor coupled to the IPD. The IPD includes a semiconductor substrate, a first conductive layer formed over and coupled to the semiconductor substrate and including a first capacitor electrode, a second conductive layer formed over and coupled to the semiconductor substrate and including a second capacitor electrode that is vertically aligned with the first capacitor electrode, dielectric material that electrically insulates the first capacitor electrode from the second capacitor electrode, wherein the first capacitor electrode, the dielectric material, and the second capacitor electrode form the first capacitor. The IPD also includes a first contact pad exposed at a top surface of the IPD and electrically coupled to the second capacitor electrode, and a second contact pad exposed at the top surface of the IPD. The second capacitor coupled to the top surface of the IPD, and having a first terminal electrically coupled to the first contact pad, and a second terminal electrically coupled to the second contact pad.

An embodiment of a packaged RF amplifier device includes a device substrate that includes a voltage reference plane, input and output leads coupled to the device substrate, a transistor coupled to a top surface of the device substrate, the transistor having a control terminal, a first current carrying terminal, and a second current carrying terminal, wherein the control terminal is electrically coupled to the input lead, and an output impedance matching circuit coupled to the top surface of the device substrate and electrically coupled between the first current carrying terminal and the output lead. The output impedance matching circuit includes an IPD assembly, a first inductor coupled between the first current carrying terminal and the output lead, and a second inductor coupled between the first current carrying terminal and the first IPD assembly. The IPD assembly includes an IPD that includes semiconductor substrate, a first conductive layer formed over and coupled to the semiconductor substrate and including a first capacitor electrode that is electrically coupled to the voltage reference plane, a second conductive layer formed over and coupled to the semiconductor substrate and including a second capacitor electrode that is vertically aligned with the first capacitor electrode, and dielectric material that electrically insulates the first capacitor electrode from the second capacitor electrode, wherein the first capacitor electrode, the dielectric material, and the second capacitor electrode form a first capacitor. The IPD also includes a first contact pad exposed at a top surface of the IPD, a second contact pad exposed at the top surface of the IPD and electrically coupled to the voltage reference plane, a third contact pad exposed at the top surface of the IPD and electrically coupled to the second capacitor electrode and the second inductor. The IPD assembly also includes a second capacitor coupled to the top surface of the IPD, and having a first terminal electrically coupled to the first contact pad, and a second terminal electrically coupled to the second contact pad.

An embodiment of an RF amplifier includes an input configured to receive a signal to be amplified, an output configured to output an amplified signal, a transistor having a control terminal electrically coupled to the input, a first current carrying terminal electrically coupled to the output, and a second current carrying terminal electrically coupled to a voltage reference plane, and an output impedance matching circuit that includes a first inductor electrically coupled between the first current carrying terminal and the output, a second inductor electrically coupled between the first current carrying terminal and a node, a first capacitor coupled between the node and the voltage reference plane, and a second capacitor coupled between the node and the voltage reference plane. The first and second capacitors form portions of an IPD assembly having an IPD that includes a semiconductor substrate, a first conductive layer formed over and coupled to the semiconductor substrate and including a first capacitor electrode that is electrically coupled to the voltage reference plane, a second conductive layer formed over and coupled to the semiconductor substrate and including a second capacitor electrode that is vertically aligned with the first capacitor electrode, and dielectric material that electrically insulates the first capacitor electrode from the second capacitor electrode, where the first capacitor electrode, the dielectric material, and the second capacitor electrode form the first capacitor. The IPD also includes a first contact pad exposed at a top surface of the IPD and electrically coupled to the second capacitor electrode, a second contact pad exposed at the top surface of the IPD and electrically coupled to the voltage reference plane, and a third contact pad exposed at the top surface of the IPD and electrically coupled to the second capacitor electrode, where the third contact pad corresponds to the node. The second capacitor is coupled to the top surface of the IPD, and the second capacitor has a first terminal electrically coupled to the first contact pad, and a second terminal electrically coupled to the second contact pad.

An embodiment of a method of manufacturing a device assembly for an RF amplifier includes forming an IPD by forming a first conductive layer over a semiconductor substrate, where the first conductive layer includes a first capacitor electrode, forming dielectric material over the first capacitor electrode, forming a second conductive layer over the dielectric material, where the second conductive layer includes a second capacitor electrode that is vertically aligned with the first capacitor electrode, and where the first capacitor electrode, the dielectric material, and the second capacitor electrode form a first capacitor. The method also includes forming a first contact pad that is exposed at a top surface of the IPD, where the first contact pad is electrically coupled to the second capacitor electrode, and forming a second contact pad that is exposed at the top surface of the IPD. The method also includes coupling a second capacitor to the top surface of the IPD to form an IPD assembly, where coupling the second capacitor to the top surface of the IPD includes coupling a first terminal of the second capacitor to the first contact pad, and coupling a second terminal of the second capacitor to the second contact pad.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A device assembly comprising:
    an integrated passive device (IPD) that includes
        a semiconductor substrate,
        a first conductive layer formed over and coupled to the semiconductor substrate and including a first capacitor electrode,
        a second conductive layer formed over and coupled to the semiconductor substrate and including a second capacitor electrode that is vertically aligned with the first capacitor electrode,
        dielectric material that electrically insulates the first capacitor electrode from the second capacitor electrode, wherein the first capacitor electrode, the dielectric material, and the second capacitor electrode form a first capacitor,
        a first contact pad exposed at a top surface of the IPD and electrically coupled to the second capacitor electrode, and
        a second contact pad exposed at the top surface of the IPD; and
    a second capacitor coupled to the top surface of the IPD, and having a first terminal electrically coupled to the first contact pad, and a second terminal electrically coupled to the second contact pad.

2. The device assembly of claim 1, further comprising:
    a resistor electrically coupled between the second capacitor electrode of the first capacitor and the first terminal of the second capacitor.

3. The device assembly of claim 2, wherein the resistor is a polysilicon resistor that is integrally formed as part of the IPD.

4. The device assembly of claim 2, wherein the resistor is a discrete component coupled to a top surface of the IPD.

5. The device assembly of claim 1, wherein the second capacitor is selected from an integrated capacitor and a discrete capacitor.

6. The device assembly of claim 1, further comprising:
a third contact pad exposed at the top surface of the IPD and electrically coupled with the second capacitor electrode, wherein the third contact pad is configured to support attachment of a plurality of bondwires to the third contact pad.

7. The device assembly of claim 1, wherein the IPD further comprises:
a plurality of conductive vias through the semiconductor substrate, wherein the plurality of conductive vias electrically couple the first capacitor electrode with a bottom surface of the IPD.

8. The device assembly of claim 1, wherein the IPD further comprises:
a plurality of conductive vias through the semiconductor substrate, wherein the plurality of conductive vias electrically couple the second contact pad with a bottom surface of the IPD.

9. The device assembly of claim 1, wherein the IPD further comprises:
a conductive layer coupled to a bottom surface of the IPD, wherein the conductive layer is electrically coupled to the first capacitor electrode and the second contact pad.

10. The device assembly of claim 1, wherein the IPD further comprises:
a third capacitor that includes a third capacitor electrode, a fourth capacitor electrode, and dielectric material electrically insulating the third capacitor electrode from the fourth capacitor electrode; and
a third contact pad exposed at the top surface of the IPD and electrically coupled with the fourth capacitor electrode, wherein the third contact pad is configured to support attachment of a plurality of bondwires to the third contact pad.

11. A packaged radio frequency (RF) amplifier device comprising:
a device substrate that includes a voltage reference plane;
an input lead coupled to the device substrate;
an output lead coupled to the device substrate;
a first transistor coupled to a top surface of the device substrate, the first transistor having a control terminal, a first current carrying terminal, and a second current carrying terminal, wherein the control terminal is electrically coupled to the input lead;
a first output impedance matching circuit coupled to the top surface of the device substrate and electrically coupled between the first current carrying terminal and the output lead, wherein the first output impedance matching circuit includes a first integrated passive device (IPD) assembly, a first inductor coupled between the first current carrying terminal and the output lead, and a second inductor coupled between the first current carrying terminal and the first IPD assembly, wherein the first IPD assembly includes
a semiconductor substrate,
a first conductive layer formed over and coupled to the semiconductor substrate and including a first capacitor electrode that is electrically coupled to the voltage reference plane,
a second conductive layer formed over and coupled to the semiconductor substrate and including a second capacitor electrode that is vertically aligned with the first capacitor electrode,
dielectric material that electrically insulates the first capacitor electrode from the second capacitor electrode, wherein the first capacitor electrode, the dielectric material, and the second capacitor electrode form a first capacitor,
a first contact pad exposed at a top surface of the IPD,
a second contact pad exposed at the top surface of the IPD and electrically coupled to the voltage reference plane,
a third contact pad exposed at the top surface of the IPD and electrically coupled to the second capacitor electrode and the second inductor, and
a second capacitor coupled to the top surface of the IPD, and having a first terminal electrically coupled to the first contact pad, and a second terminal electrically coupled to the second contact pad.

12. The packaged RF amplifier of claim 11, further comprising:
a resistor electrically coupled between the second capacitor electrode and the first terminal of the second capacitor.

13. The packaged RF amplifier device of claim 11, wherein:
the first inductor comprises a first plurality of bondwires coupled between the first current carrying terminal and the output lead; and
the second inductor comprises a second plurality of bondwires coupled between the first current carrying terminal and the third contact pad.

14. The packaged RF amplifier device of claim 11, further comprising:
at least one additional transistor coupled to the top surface of the device substrate; and
at least one additional output impedance matching circuit coupled to the top surface of the device substrate, wherein each of the at least one additional output impedance matching circuits includes an additional IPD assembly coupled to the top surface of the device substrate and electrically coupled between one of the additional transistors and the output lead, and
wherein the first transistor and the first output impedance matching circuit form a portion of a first amplification path, and wherein each additional transistor and the additional output impedance matching network to which each additional transistor is coupled form a portion of an additional amplification path that is in parallel with the first amplification path between the input lead and the output lead.

15. A radio frequency (RF) amplifier comprising:
an input configured to receive a signal to be amplified;
an output configured to output an amplified signal;
a transistor having a control terminal electrically coupled to the input, a first current carrying terminal electrically coupled to the output, and a second current carrying terminal electrically coupled to a voltage reference plane; and
an output impedance matching circuit that includes a first inductor electrically coupled between the first current carrying terminal and the output, a second inductor electrically coupled between the first current carrying terminal and a node, a first capacitor coupled between the node and the voltage reference plane, and a second capacitor coupled between the node and the voltage reference plane, and wherein the first and second capacitors form portions of an integrated passive device (IPD) assembly having an IPD that includes
a semiconductor substrate,
a first conductive layer formed over and coupled to the semiconductor substrate and including a first capacitor electrode that is electrically coupled to the voltage reference plane,
a second conductive layer formed over and coupled to the semiconductor substrate and including a second capacitor electrode that is vertically aligned with the first capacitor electrode,
dielectric material that electrically insulates the first capacitor electrode from the second capacitor electrode, wherein the first capacitor electrode, the dielectric material, and the second capacitor electrode form the first capacitor,
a first contact pad exposed at a top surface of the IPD and electrically coupled to the second capacitor electrode,
a second contact pad exposed at the top surface of the IPD and electrically coupled to the voltage reference plane, and
a third contact pad exposed at the top surface of the IPD and electrically coupled to the second capacitor electrode, wherein the third contact pad corresponds to the node, and
wherein the second capacitor is coupled to the top surface of the IPD, and the second capacitor has a first terminal electrically coupled to the first contact pad, and a second terminal electrically coupled to the second contact pad.

16. The RF amplifier of claim 15, wherein the output impedance matching network and the IPD assembly further comprise:
a resistor electrically coupled between the second capacitor electrode of the first capacitor and the first terminal of the second capacitor.

17. A method of manufacturing a device assembly for a radio frequency amplifier, the method comprising the steps of:
forming an integrated passive device (IPD) by
forming a first conductive layer over a semiconductor substrate, wherein the first conductive layer includes a first capacitor electrode,
forming dielectric material over the first capacitor electrode,
forming a second conductive layer over the dielectric material, wherein the second conductive layer includes a second capacitor electrode that is vertically aligned with the first capacitor electrode, and wherein the first capacitor electrode, the dielectric material, and the second capacitor electrode form a first capacitor,
forming a first contact pad that is exposed at a top surface of the IPD, wherein the first contact pad is electrically coupled to the second capacitor electrode, and
forming a second contact pad that is exposed at the top surface of the IPD; and
coupling a second capacitor to the top surface of the IPD to form an IPD assembly, wherein coupling the second capacitor to the top surface of the IPD includes coupling a first terminal of the second capacitor to the first contact pad, and coupling a second terminal of the second capacitor to the second contact pad.

18. The method of claim 17, further comprising:
coupling an input lead and an output lead to a device substrate;
attaching a transistor to a top surface of the device substrate, wherein the transistor includes a control terminal, a first current carrying terminal, and a second current carrying terminal;
attaching the IPD assembly to the top surface of the device substrate;
electrically coupling the input lead to the control terminal of the transistor;
electrically coupling the first current carrying terminal to the output lead; and
electrically coupling the first current carrying terminal to the second capacitor electrode of the IPD.

19. The method of claim 18, further comprising:
attaching one or more isolation structures to the top surface of the device substrate, wherein the input lead is attached to a first portion of the isolation structure, and the output lead is attached to a second portion of the isolation structure; and
attaching a lid over portions of the input lead, the output lead, the isolation structure, the transistor, and the IPD assembly to form an air cavity device package.

20. The method of claim 18, further comprising:
covering portions of the input lead, the output lead, the transistor, and the IPD assembly with molding compound to form an overmolded device package.

* * * * *